(12) United States Patent
Vega et al.

(10) Patent No.: US 12,057,387 B2
(45) Date of Patent: Aug. 6, 2024

(54) DECOUPLING CAPACITOR INSIDE GATE CUT TRENCH

(71) Applicant: International Business Machines Corporation, Armonk, NY (US)

(72) Inventors: Reinaldo Vega, Mahopac, NY (US); David Wolpert, Poughkeepsie, NY (US); Takashi Ando, Eastchester, NY (US); Praneet Adusumilli, Somerset, NJ (US); Cheng Chi, Jersey City, NJ (US)

(73) Assignee: International Business Machines Corporation, Armonk, NY (US)

( * ) Notice: Subject to any disclaimer, the term of this patent is extended or adjusted under 35 U.S.C. 154(b) by 188 days.

(21) Appl. No.: 17/110,381

(22) Filed: Dec. 3, 2020

(65) Prior Publication Data

US 2022/0181252 A1  Jun. 9, 2022

(51) Int. Cl.
| | |
|---|---|
| *H01L 23/522* | (2006.01) |
| *H01L 23/528* | (2006.01) |
| *H01L 29/423* | (2006.01) |
| *H01L 29/66* | (2006.01) |
| *H01L 29/94* | (2006.01) |
| *H01L 49/02* | (2006.01) |

(52) U.S. Cl.
CPC ...... *H01L 23/5223* (2013.01); *H01L 23/5226* (2013.01); *H01L 23/5286* (2013.01); *H01L 28/55* (2013.01); *H01L 29/4236* (2013.01); *H01L 29/66181* (2013.01); *H01L 29/945* (2013.01)

(58) Field of Classification Search
CPC ............... H01L 23/5223; H01L 28/55; H01L 29/66181; H01L 29/945; H01L 27/0629
See application file for complete search history.

(56) References Cited

U.S. PATENT DOCUMENTS

| | | | | |
|---|---|---|---|---|
| 5,393,691 A | * | 2/1995 | Hsu | H01L 27/0629 438/210 |
| 6,090,661 A | * | 7/2000 | Perng | H10B 12/038 257/E21.651 |
| 6,342,712 B1 | * | 1/2002 | Miki | H01L 28/60 257/310 |
| 6,492,244 B1 | | 12/2002 | Christensen | |
| 6,947,275 B1 | | 9/2005 | Anderson | |
| 7,102,204 B2 | | 9/2006 | Berndlmaier | |
| 8,117,581 B1 | | 2/2012 | Li | |
| 8,969,938 B2 | | 3/2015 | Cheng | |

(Continued)

OTHER PUBLICATIONS

"Patent Cooperation Treaty PCT Notification of Transmittal of the International Search Report and the Written Opinion of the International Searching Authority, or the Declaration", International application No. PCT/EP2021/083573, International filing date Nov. 30, 2021 (Nov. 30, 2021), Date of Mailing May 20, 2022 (May 20, 2022), 24 pages.

*Primary Examiner* — Phat X Cao
(74) *Attorney, Agent, or Firm* — Edward J. Wixted, III

(57) ABSTRACT

An approach to forming a semiconductor device where the semiconductor device includes a first power rail with one or more vertically stacked contact vias connecting to the first power rail to a portion of a first de-coupling capacitor. The semiconductor device includes the first de-coupling capacitor in a first portion of a semiconductor substrate in a first gate cut trench.

21 Claims, 13 Drawing Sheets

(56) References Cited

U.S. PATENT DOCUMENTS

| | | |
|---|---|---|
| 9,082,886 B2 | 7/2015 | Chen |
| 9,245,884 B1 | 1/2016 | Erickson |
| 9,385,177 B2 * | 7/2016 | Zhang ................ H01L 23/5252 |
| 9,391,156 B2 * | 7/2016 | Moll ................... H01L 29/4966 |
| 9,716,036 B2 * | 7/2017 | Chang ................ H01L 27/1203 |
| 10,128,327 B2 | 11/2018 | Zhang |
| 10,629,474 B1 | 4/2020 | Hu |
| 11,011,520 B2 * | 5/2021 | Lu ....................... H10B 12/0387 |
| 11,031,404 B2 * | 6/2021 | Lu ........................ H10B 12/056 |
| 11,316,027 B2 * | 4/2022 | Chang .................... H01L 28/55 |
| 2013/0001746 A1 | 1/2013 | Edwards |
| 2018/0061839 A1 | 3/2018 | Baars |
| 2018/0323255 A1 | 11/2018 | Cheng |
| 2018/0374791 A1 | 12/2018 | Smith |
| 2020/0006467 A1 | 1/2020 | Lin |
| 2020/0058564 A1 | 2/2020 | Hsu |
| 2020/0152622 A1 * | 5/2020 | Cheng ............. H01L 21/823807 |
| 2022/0173109 A1 * | 6/2022 | Rigano ............. H01L 29/78642 |

* cited by examiner

Key:
Gate cut trench depth = 0nm

- - - - - 4.4 eV work function metal placed on top of ferroelectric material
———— 4.9 eV work function metal placed on top of ferroelectric material
·········· Reference metal oxide semiconductor with standard cap and 4.4 eV work function metal Key:
Gate cut trench depth = 20nm

- - - - - 4.4 eV work function metal placed on top of ferroelectric material
———— 4.9 eV work function metal placed on top of ferroelectric material
············ Reference metal oxide semiconductor with standard cap and 4.4 eV work function metal Key:
Gate cut trench depth = 20nm

- - - - - 4.4 eV work function metal placed on top of ferroelectric material
———— 4.9 eV work function metal placed on top of ferroelectric material
············ Reference metal oxide semiconductor with standard cap and 4.4 eV work function metal

DECOUPLING CAPACITOR INSIDE GATE CUT TRENCH

BACKGROUND OF THE INVENTION

The present invention relates generally to the field of semiconductor memory device technology and more particularly to forming de-coupling capacitors inside a gate cut trench under a power rail in a semiconductor circuit.

Semiconductor device manufacturing and design are continually packaging more circuits into semiconductor chips as line widths and spacing between device elements shrink, while still striving for increasing semiconductor device performance. Traditionally, transistors are formed on the semiconductor substrate and are connected together by layers of interconnects and power structures formed above the transistors. Conventional power rails, commonly used with memory devices such as static-random access memory (SRAM), typically reside in the interconnect layers above the transistors. Conventional power rails in interconnect layers consume a significant amount of area and to meet semiconductor performance requirements, typically, use large power supply guardbands to address power rail noise. To reduce power rail noise and improve semiconductor device performance, de-coupling capacitors, such as metal-insulator-metal capacitors (MIMCAPs) formed in the interconnect layers, or deep trench capacitors formed in an insulating layer of a silicon-on-insulator semiconductor substrates, are used to reduce power rail noise and increase semiconductor device performance.

SUMMARY

Embodiments of the present invention provide a semiconductor structure for a semiconductor device and a method of forming the semiconductor structure where the semiconductor structure includes a first power rail with one or more vertically stacked contact vias electrically connecting to the first power rail to a portion of a first de-coupling capacitor. The semiconductor structure includes the first de-coupling capacitor in a first portion of a semiconductor substrate in a first gate cut trench.

Embodiments of the present invention provide a semiconductor structure for a semiconductor device and a method of forming the semiconductor structure where the semiconductor structure includes a first gate cut trench in a first portion of a semiconductor substrate under a first power rail, and a first metal layer on the first portion of the semiconductor substrate. The semiconductor structure includes a dielectric layer on the first metal layer on the first portion of the semiconductor substrate, and a ferroelectric layer on the dielectric layer on the first portion of the semiconductor substrate and on a bottom portion of a shallow isolation trench above the semiconductor substrate and in a portion of the gate cut trench.

Embodiments of the present invention provide a semiconductor structure of a semiconductor device and a method of forming the semiconductor structure where the semiconductor structure includes a power rail and a gate cut trench under the power rail. The semiconductor structure includes a dielectric layer on a portion of a semiconductor substrate in the gate cut trench. Furthermore, the semiconductor structure includes a ferroelectric layer on the dielectric layer and on vertical sides of the gate cut trench above the semiconductor substrate, and a metal inside the ferroelectric layer.

BRIEF DESCRIPTION OF THE DRAWINGS

The above and other aspects, features, and advantages of various embodiments of the present invention will be more apparent from the following description taken in conjunction with the accompanying drawings.

DETAILED DESCRIPTION

Figure 1:
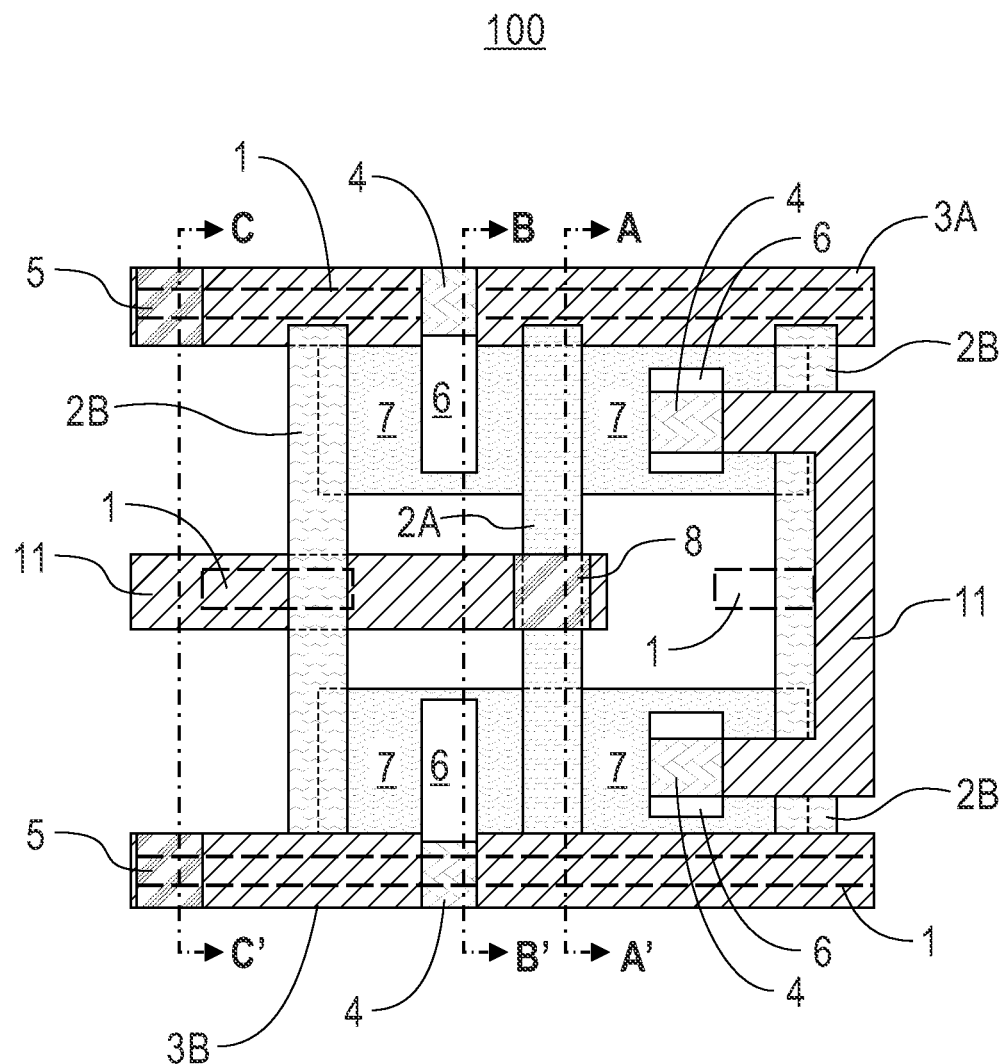
FIG. 1 is a top down view of a layout of a semiconductor circuit with two power rails, in accordance with an embodiment of the present invention.

Embodiments of the present invention recognize that power rails typically reside in the interconnect layers above the transistors. Embodiments of the present invention recognize that power rail noise is detrimental to system performance. Power rail noise increases the instantaneous peak drain voltage supply or increases Vdd throughout a noise cycle. The increase in power rail noise drives an increase in Vdd guardband requirements which, in turn, reduces the nominal voltage. Embodiments of the present invention recognize that the larger the guardband, the lower the nominal operating voltage of the semiconductor circuit and therefore the lower the performance for a given semiconductor circuit design. Embodiments of the present invention recognize that reducing power rail noise allows an increase to the nominal operating voltage in the semiconductor circuit design and therefore, provides more performance from the semiconductor circuit design.

Embodiments of the present invention recognize that de-coupling capacitors reduce power rail noise. In some cases, deep trench capacitors or MIMCAPs, in the back end of the line (BEOL) are used as de-coupling capacitors to reduce noise. Embodiments of the present invention recognize that the metal-insulator-metal capacitors (MIMCAPs) formed in the back end of the line (BEOL) semiconductor processes provide lower capacitor density and a limited frequency response due to the resistive network in the BEOL wiring. Embodiments of the present invention recognize that placing a de-coupling capacitor with high capacitance density as close as possible to the power rail provides improvements in semiconductor chip and system performance.

Embodiments of the present invention provide a method of forming de-coupling capacitors in gate cut trenches in the semiconductor substrate. The de-coupling capacitors in the gate cut trenches run parallel to and below the power rail. In order to form the de-coupling capacitors in the semiconductor substrate below the power rails, the gate cut trench is cut or etched deeper than a conventional gate cut trench. Embodiments of the present invention include a method of forming the de-coupling capacitors in a top portion of the semiconductor substrate by performing one or more etches that remove a portion of the gate, a portion of the shallow trench isolation (STI) under the removed portion of the gate, and a top portion of the semiconductor substrate. While gate cut trenches are typically etched through the ends of the gates and extend downward to a top surface of the STI, embodiments of the present invention etch the gate cut trench deeper so that the gate cut trench extends into a top portion of semiconductor substrate. Extending the gate cut trench into the semiconductor substrate allows a deposition of the de-coupling capacitor materials in the gate cut trench in the semiconductor substrate. The de-coupling capacitors, formed in the deep gate cut trench in the semiconductor substrate directly below the power rail, are closer to the power rail than traditional MIMCAPs or traditional deep trench de-coupling capacitors.

Embodiments of the present invention provide de-coupling capacitors in the semiconductor substrate using a deeper gate cut trench that reduces power rail noise, providing closer proximity to the power rail than MIMCAPs or traditional deep trench capacitors. Placing the de-coupling capacitors closer to the power rail reduces resistor-capacitor (RC) circuit delay between the de-coupling capacitor and the power rail and improves frequency response. Furthermore, the de-coupling capacitors embedded in the semiconductor substrate enable smaller power rail guardbands and a higher nominal voltage for improved semiconductor circuit performance.

Embodiments of the present invention provide a number of different material combinations and semiconductor structures for the de-coupling capacitors in the gate cut trench to allow design trade-offs in processes and materials resulting in different levels of performance of the de-coupling capacitors. Embodiments of the present invention provide de-coupling capacitors in the semiconductor substrate with different stack combinations of dielectric materials, ferroelectric materials, and metals, that result in different electrical performance of the de-coupling capacitors. Embodiments of the present invention provide a dielectric material and ferroelectric material forming the de-coupling capacitor. Embodiments of the present invention also provide a metal material, high k dielectric material, and ferroelectric material in a metal-ferroelectric-insulator-metal (MFIM) stack forming another de-coupling capacitor. Embodiments of the present invention provide a method of forming larger de-coupling capacitors in the semiconductor substrate to improve the capacitance density of the de-coupling capacitor by increasing the depth of the gate cut trench in the semiconductor substrate.

Embodiments of the present invention provide a method of forming the de-coupling capacitor in the semiconductor substrate. The method includes increasing the etch depth of the gate cut trench using one or more etch processes and a single gate cut etch mask. The method includes performing a standard gate cut trench etch, for example, to the top of the STI, and then, deepening the standard gate cut trench by etching through the STI and continuing the etch into the semiconductor substrate. One or more etch processes are used to increase the depth of the etched gate cut trench to extend the gate cut trench into the semiconductor substrate. The method includes etching the gate cut trench below and parallel to where the power rails will be formed in later steps.

The method further includes forming a layer of a dielectric material on the semiconductor substrate surface in the deeper gate cut trench. After forming the layer of the dielectric material, a deposition of a ferroelectric material in the gate cut trench occurs. A first metal material is deposited in a recessed portion of the gate cut trench (e.g., over de-coupling capacitor). The ferroelectric material and the first metal material are etched down to a level below the top surface of the STI. In the method, a dielectric material is deposited in the gate cut trench over the metal material and over the ferroelectric material. A selective etch of the dielectric material in one end of the gate cut trench can occur with a selective etch of the dielectric material over a center portion of the gate cut trench that contacts a top surface of the gate. Another metal layer is deposited over the semiconductor substrate and into the portion of the gate cut trench where the dielectric material was removed to create a contact via connecting to the de-coupling capacitors and to create a contact to the gate.

Embodiments of the present invention provide a method of forming de-coupling capacitors connecting to one end of the power rail and extending parallel to and under the power rail in the semiconductor substrate in order to reduce power rail noise and improve chip performance.

FIGS. 1-6C and 11-16 illustrate exemplary semiconductor structures that include two de-coupling capacitors, each under a power rail and connected at one end to the power rail. In embodiments of the present invention, the semiconductor structures depicted in FIGS. 2-5C depict a metal-ferroelectric-insulator-semiconductor (MFIS) stack in the gate cut trench. In embodiments of the present invention, the semiconductor structures in FIGS. 6A-6C depict a metal-ferroelectric-insulator-metal (MFIM) stack in the gate cut trench.

FIG. 1 is a top down view of layout 100 of a semiconductor circuit with power rail 3A and 3B in accordance with an embodiment of the present invention. While layout 100 relates to an inverter as a logic cell or a device circuit using fins in the active region 7, the semiconductor circuit is not limited to layout 100 of the inverter with fins. For example, layout 100 could represent a logic cell or a logic gate, such as, a NOT-AND (NAND) gate or a NOT-OR (NOR) gate. A NAND gate is a logic gate which produces an output which is false only if all its inputs are true. A NOR gate as a logic gate or device circuit produces a positive output when both inputs are negative. In other embodiments, another type of device circuit can be formed using another type of semiconductor structure, such as, a planar structure (e.g., a planar field effect transistor rather than a fin field effect transistor) or a nanosheet structure.

While FIG. 1 depicts two power rails, in other embodiments more than two power rails are present in the semiconductor circuit or logic cell of layout 100. As depicted, FIG. 1 includes gate cut mask 1, gate 2A, auxiliary gate 2B, power rail 3A and 3B, via contact 4, trench contact via 5, gate contact via 8, source/drain contact 6 which extends under via contact 4, active region 7, line 11 in a first metal layer (M1), and an illustration of sections A-A', B-B', and C-C' through the semiconductor circuit of layout 100. As depicted in FIG. 1, each contact of the pair of trench contact via 5 connect to one of power rail 3A or to power rail 3B. Section C-C' in FIG. 4 further illustrates each of trench contact via 5 connecting to a de-coupling capacitor formed in a gate cut trench and connecting to one of power rail 3A or 3B by via contact 4. In this way, each of power rail 3A and 3B directly connects by one of trench contact via 5 to a de-coupling capacitor in the gate cut trench under power rail 3A and 3B (depicted in FIG. 4).

Power rail 3A and 3B reside in at least the first metal layer, or M1, and, as known to one skilled in the art, power rail 3A and 3B can also reside in one or more metal layers above M1 (not depicted). In various embodiments of the present invention, power rail 3A and 3B are considered to include trench contact via 5, via contact 4, and a metal material (e.g., metal 20 in FIG. 4) that are below and electrically connected to power rail 3A and 3B. In various embodiments, power rail 3A is a ground power rail. In various embodiments, power rail 3B is a direct current power supply (VDD) power rail that is associated with an n-well. An n-well is a portion of the semiconductor substrate that is doped with an n-type material (e.g., can be a part of a p-type field effect transistor (PFET)). In other examples, the ground and VDD functions of power rails 3A and 3B may be reversed (e.g., power rail 3A is a VDD power rail).

Figure 2:
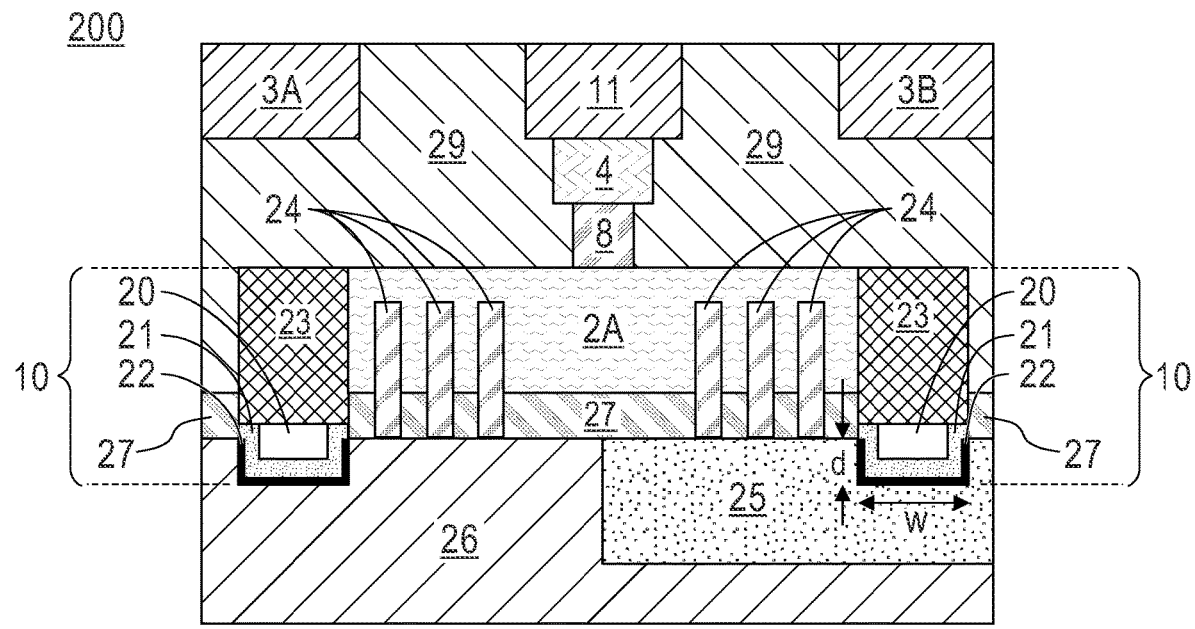
FIG. 2 is a cross-sectional view of a semiconductor structure through section A-A' of the layout of a semiconductor circuit of FIG. 1, in accordance with an embodiment of the present invention.

In various embodiments, gate cut mask 1 indicates the locations where a portion of gate 2A is removed as depicted in FIG. 2. As known to one skilled in the art, gate cut mask 1 can be used to define a cut or an etch perpendicular to a direction of gate 2A (e.g., when used to etch gate 2A, gate mask 1 define the ends of gate 2A). In this way, when an edge or end of gate 2A is formed by an etch of gate 2A using gate cut mask 1, the edge provides improved electrical performance for gate 2A as compare to a gate that is not formed using gate cut mask 1. Gate cut mask 1 on auxiliary gate 2B may not be present but, is depicted as a possible location for gate cut mask 1 on auxiliary gate 2B in other examples. In FIG. 1, one gate cut mask 1 is under each of power rail 3A and 3B and runs parallel to power rail 3A and 3B, respectively.

Figure 4:
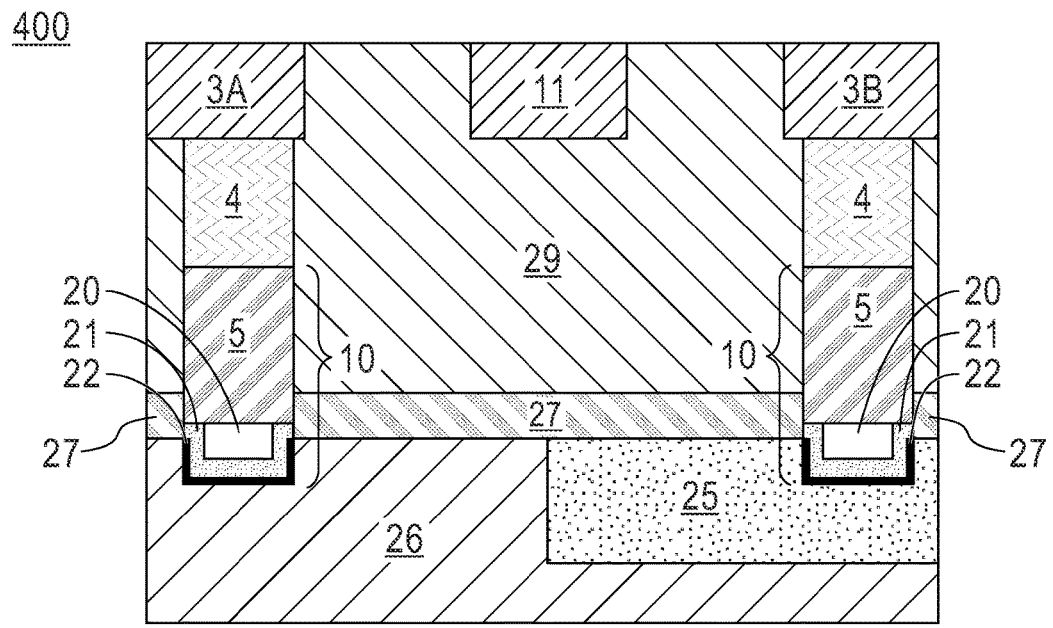
FIG. 4 is a cross-sectional view of the semiconductor structure through section C-C' of the layout of the semiconductor circuit of FIG. 1, in accordance with an embodiment of the present invention.

As depicted, line 11 on the left side of layout 100 can be an input to the semiconductor circuit depicted in layout 100 and line 11 on the right side of layout 100 can be an output of the semiconductor circuit. In various embodiments, active region 7 in the bottom portion of layout 100 is associated with an n-well to form p-type field effect transistor (PFET). In some embodiments, active region 7 in the bottom portion of layout 100 is associated with a p-well to form a NFET. While depicted as layout 100 for an inverter, in other embodiments, the de-coupling capacitors under of power rail 3A and 3B, as depicted in FIG. 4, are associated with another type of circuit device, such as a NAND gate, NOR gate, or a buffer logic gate, but are not limited these types of semiconductor device circuits or logic cells.

FIG. 2 is a cross-sectional view of semiconductor structure 200 through section A-A' of layout 100 depicted in FIG. 1, in accordance with an embodiment of the present invention. Cross-section A-A' is parallel to gate 2A and goes through the gate (e.g., A-A' is in gate 2A running parallel to the length or long dimension of gate 2A) such that each of gate cut trench 10 is perpendicular to gate 2A and cuts through gate 2A. While depicted with interlayer dielectric material (ILD) 29 on one side of dielectric cap 23 in gate cut trench 10, in other embodiments, gate 2A is present on both sides of dielectric cap 23 above STI 27.

As depicted, gate cut trench 10, under each of power rail 3A and 3B, extends down from a top of gate 2A into a top portion of semiconductor substrate 26 and n-well 25. Gate cut trench 10 includes dielectric layer 22, ferroelectric layer 21, metal 20 inside ferroelectric layer 21, and dielectric cap 23 over metal 20 and a portion of ferroelectric layer 21. Ferroelectric layer 21 and dielectric layer 22 form a de-coupling capacitor in gate cut trench 10. The de-coupling capacitors have a depth, d, in semiconductor substrate 26 and n-well 25. Power rail 3A and 3B are each above and parallel to a de-coupling capacitor formed from ferroelectric layer 21 and dielectric layer 22.

As depicted, FIG. 2 also includes gate contact via 8 vertically stacked under via contact 4, connecting gate 2A to line 11 which is formed from a portion of the M1 metal layer. Fins 24 are on a portion of n-well 25 and on a portion of semiconductor substrate 26. As known to one skilled in the art, fins 24 can be in active region 7 (depicted in FIG. 1). Shallow trench isolation (STI) 27 is above portions of semiconductor substrate 26 and n-well 25. ILD 29 is over gate 2A, over a portion of STI 27, over and surrounding dielectric cap 23, and surrounding gate contact via 8, via contact 4, line 11, power rail 3A and 3B. As depicted, the de-coupling capacitor formed by ferroelectric layer 21 and dielectric layer 22 may have a depth, d, into semiconductor substrate 26 and n-well 25 and a width, w.

Dielectric layer 22 can be over a surface of semiconductor substrate 26 and n-well 25 in gate cut trench 10. Ferroelectric layer 21 can be over dielectric layer 22 and inside a portion of STI 27 within gate cut trench 10. The top surface of ferroelectric layer 21 is below a bottom surface of gate 2A. A middle portion of gate cut trench 10 may be filled with metal 20. Metal 20 can be surrounded by ferroelectric layer 21 (e.g., around sides and bottom of metal 20) and covered by dielectric cap 23 which fills the remaining portions of gate cut trench 10. Gate cut trench 10 abuts each end of gate 2A. The de-coupling capacitors are formed in gate cut trench 10 etched with a width, w, into gate 2A and a portion of ILD 29 down into semiconductor substrate 26 and n-well 25 with a depth, d, into semiconductor substrate 26 and n-well 25. In other embodiments, semiconductor substrate 26 also contains a p-well under fins 24 associated with power rail 3A.

Gate cut trench 10 in FIG. 2 extends from a top surface of gate 2A to the depth, d, in semiconductor substrate 26 and n-well 25. In one embodiment, gate cut trench 10 contacts the top surface of semiconductor substrate 25 and n-well 26 but does not go into semiconductor substrate 26 and n-well 25. As discussed in detail later, the depth, d, of gate cut trench 10 changes the capacitance of the de-coupling capacitors (e.g., deeper etched gate cut trenches with a greater depth, d, can provide more capacitance).

Dielectric layer 22 is inside gate cut trench 10 (e.g., lines gate cut trench 10). Dielectric layer 22 is on the surface of the portions of semiconductor substrate 26 and n-well 25 inside gate cut trench 10. As depicted, dielectric layer 22 is under a portion of ferroelectric layer 21. In various embodiments, dielectric layer 22 is a thin layer of silicon dioxide. In other embodiments, dielectric layer 22 is a dielectric material commonly used in gate stacks (e.g., silicon dioxide ($SiO_2$), or a composite stack of hafnium dioxide ($HfO_2$) and a silicon oxide (SiOx), or an aluminum oxide ($Al_2O_5$).

Ferroelectric layer 21 and dielectric layer 22, as depicted, reside in a gate trench etched into substrate 26 and n-well 25. The selection of the materials for metal 20, ferroelectric layer 21, and a dielectric material, such as, dielectric layer 22, at least in part, determines the amount of capacitance or capacitance density provided by the de-coupling capacitors formed by ferroelectric layer 21 and dielectric layer 22. In various embodiments, ferroelectric layer 21 is hafnium zirconium oxide (HZO). In other embodiments, ferroelectric layer 21 is one of lead zirconium titanate (PZT), silicon-doped hafnium oxide ($Si:HfO_2$), or barium titanite. However, ferroelectric layer 21 is not limited to these materials and may another suitable ferroelectric material.

Metal 20 resides inside ferroelectric layer 21 and the top surface of ferroelectric layer 21. A top of metal 20 can be below the top surface of STI 27, below the bottom surface of gate 2A, and above the top surface of semiconductor substrate 26 and n-well 26. As depicted, the top surface of metal 20 is in about the middle portion of STI 27. In various embodiments, metal 20 is composed of one or more of metal materials. As known to one skilled in the art, the work function of a metal depends on the structure of the metal, such as, the crystal plane at of the interface between the work function metal and dielectric or ferroelectric layer, as well as the chemical composition of the metal. For example, thin layer of a work function metal (WFM) can reside on ferroelectric layer 21 with a bulk metal over the WFM. In this case, metal 20 can be composed of a tungsten metal and a WFM, such as, titanium nitride or doped aluminum. Metal 20 is not limited to these materials but, for example, may be metals used in a replacement metal gate process.

Figure 7:
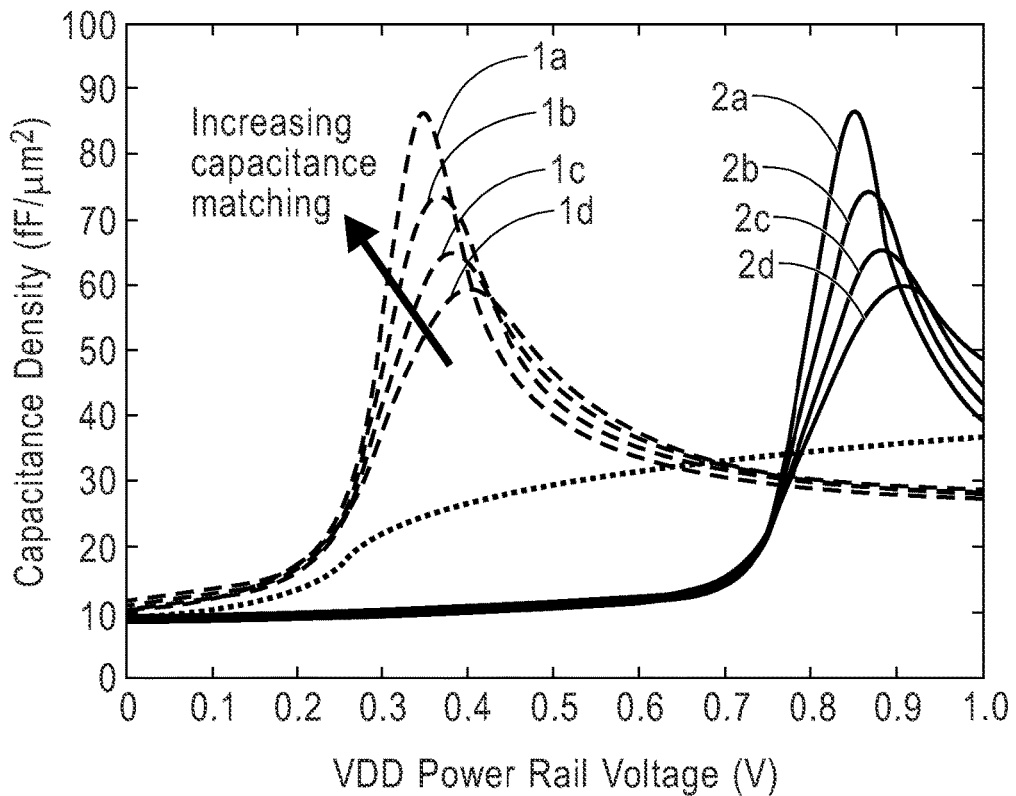
FIG. 7 is a graph depicting the results of a technology computer aided design (TCAD) analysis of a 4.4 eV work function metal placed on top of a ferroelectric material and a 4.9 eV work function metal placed on top of a ferroelectric material when there is no gate cut trench, in accordance with a second embodiment of the present invention.
Figure 8:
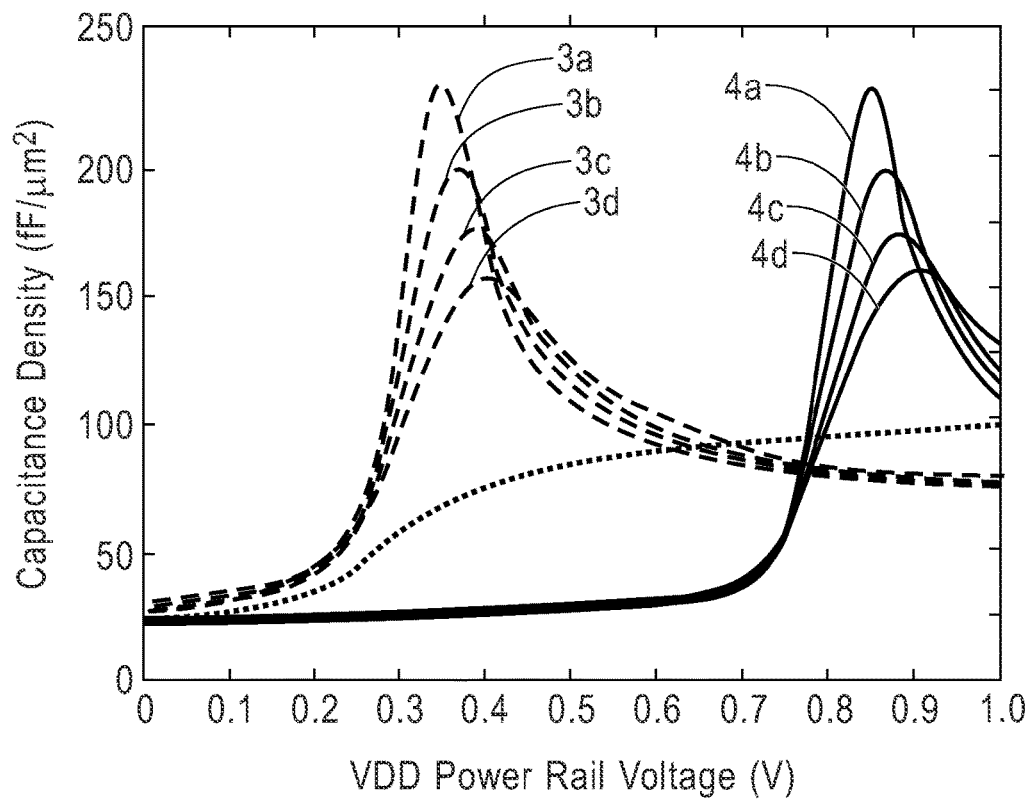
FIG. 8 is a graph depicting the results of TCAD analysis of the 4.4 eV work function metal placed on top of a ferroelectric material, and the 4.9 eV work function metal placed on top of a ferroelectric material, when the gate cut trench depth is 20 nm, in accordance with the second embodiment of the present invention.

In various embodiments, the selection of a material for ferroelectric layer 21 and dielectric layer 22, and the depth, d, and width, w, of gate cut trench 10 each impacts the capacitance of the de-coupling capacitors. The depth, d, of gate cut trench 10 during the etch of gate 2A, STI 27, and semiconductor substrate 26 which includes n-well 25 can affect the capacitance provided by ferroelectric layer 21 with dielectric layer 22. In various embodiments, increasing the depth, d, of gate cut trench 10 in semiconductor substrate 26 and n-well 25 increases the amount of capacitance generated by de-coupling capacitors formed in gate cut trench 10 (e.g., when composed of the same materials for ferroelectric layer 21 and dielectric layer 22). FIGS. 7 and 8 depict the effect of changing the depth, d, of gate cut trench 10 on capacitance density of the de-coupling capacitors in gate cut trench 10.

Dielectric cap 23 resides above a top surface of metal 20 and a top surface of ferroelectric layer 21 that surrounds the vertical sides of metal 20 in gate cut trench 10. As depicted, STI 27 surrounds a bottom portion of one side of dielectric cap 23 and ILD 29 surrounds the outer sides of a top portion of ferroelectric layer 21 and the top portion of ferroelectric layer 21. In various embodiments, gate 2A is adjacent to the inside upper portions of ferroelectric layer 21. As depicted, in some embodiments, ILD 29 is adjacent to the upper portion of the outside (e.g., left and right) portion of dielectric cap 23 and gate 2A is adjacent to the upper portion of the inside portion of dielectric cap 23 (depicted in FIG. 1). In an embodiment (not depicted), both sides of dielectric cap 23 are surrounded by gate 2A.

In various embodiments, semiconductor substrate 26 includes n-well 25 in a portion of semiconductor substrate 26. Semiconductor substrate 26 (e.g., with n-well 25) can be composed of a silicon substrate, a group IV semiconductor material, a group III-V semiconductor material, a group II-VI semiconductor material, or other known semiconductor material used in semiconductor circuits. In various embodiments, substrate 26 is a wafer or a portion of a wafer. In some embodiments, semiconductor substrate 26 includes one or more of doped, undoped, or contains doped regions, undoped regions, stressed regions, or defect rich regions. As depicted, FIG. 2 includes n-well 25 which is a portion of semiconductor substrate 26 that is doped with a n-type material using known semiconductor processes. In some embodiments, a portion of semiconductor substrate 26 that is under the left most dielectric layer 22 and the left most fins 24 between a portion of STI 27 is doped for a p-well (not depicted). In various embodiments, one or more portions of semiconductor substrate 26 are doped with a p-type dopant, doped with a n-type dopant, or are undoped.

Figure 3:
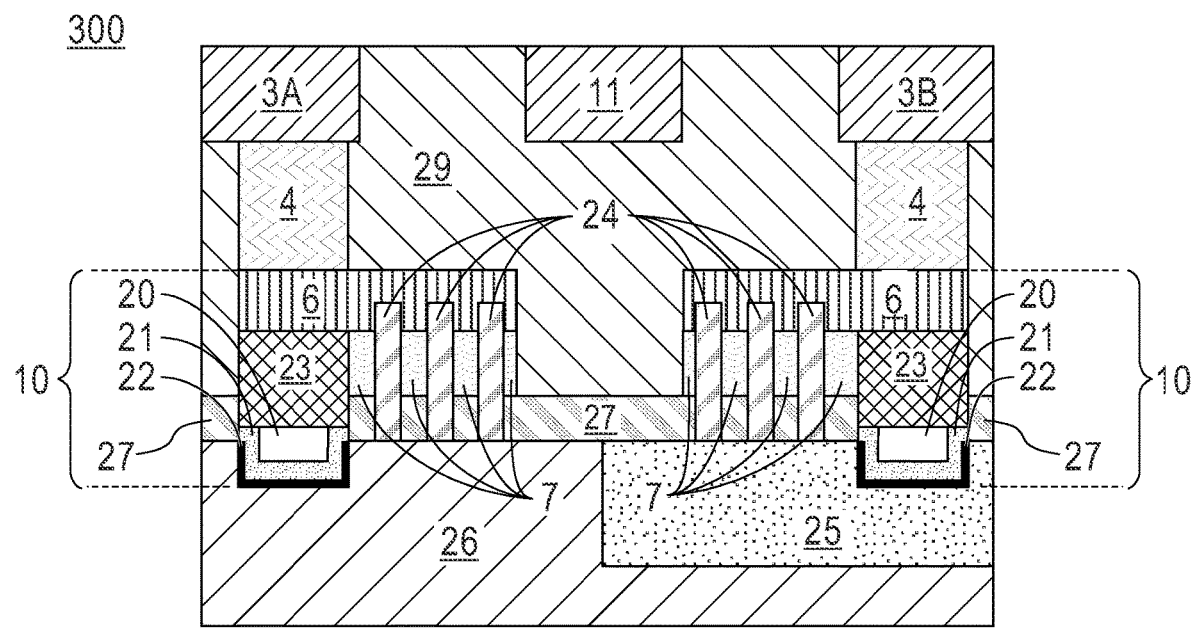
FIG. 3 is a cross-sectional view of the semiconductor structure through section B-B' of the layout of the semiconductor circuit of FIG. 1, in accordance with an embodiment of the present invention.

FIG. 3 is a cross-sectional view of the semiconductor structure 300 through section B-B' of layout 100 of the semiconductor circuit of FIG. 1 in accordance with an embodiment of the present invention. Cross-section B-B' bisects an area of layout 100 in FIG. 1 that is over a portion of active area 7. Semiconductor structure 300 depicts fins 24 in active area connecting to one of power rail 3A or 3B through source/drain contact 6 and via contact 4. As depicted, the de-coupling capacitors formed by ferroelectric layer 21 and dielectric layer 22 are outside of active area 7 and isolated by a portion of STI 27.

As depicted, FIG. 3 also includes gate cut trench 10 filled with capacitor dielectric cap 23 in a top portion of gate cut trench 10 that is above metal 20 which is over and inside ferroelectric layer 21. Dielectric layer 22 is under ferroelectric layer 21 and on surfaces of a portion of semiconductor substrate 26 and n-well 25. Fins 24 are on a portion of n-well 25 and substrate 26, and shallow trench isolation (STI) 27 is over portions of n-well 25 and substrate 26. ILD 29 surrounds line 11, surrounds portions of power rail 3A and 3B, surrounds via contact 4, surrounds portions of active area 7, and surrounds portions of dielectric cap 23. Power rail 3A and 3B can provide supply voltage (e.g., VDD or ground) through via contact 4 and source/drain contact 6 to fins 24 in active area 7.

In some embodiments, active area 7 is a portion of a PFET. For example, as depicted, when a portion of semiconductor substrate 26 under active area 7 is a n-well connecting to power rail 3B by source/drain contact 6 and via contact 4 can be an PFET.

The two de-coupling capacitors composed of ferroelectric layer 21 and dielectric layer 22 are essentially the same as the two de-coupling capacitors discussed above in detail with reference to FIG. 2. Dielectric cap 23 in FIG. 3 is shorter than dielectric cap 23 in FIG. 2 as dielectric cap 23 in FIG. 3 is depicted under source/drain contact 6.

FIG. 4 is a cross-sectional view of the semiconductor structure 400 through section C-C' of layout 100 of the semiconductor circuit of FIG. 1 in accordance with an embodiment of the present invention. Cross-section C-C' in layout 100 cuts through one end of power rail 3A and 3B that is outside of active area 7. As depicted, FIG. 4 includes power rail 3A and 3AB connecting through via contact 4 and trench contact via 5 to metal 20 inside a portion of the de-coupling capacitors formed by ferroelectric layer 21 and dielectric layer 22. A top portion of gate cut trench 10 is filled with trench contact via 5 over a top surface of metal 20 and over portions of a top surface of ferroelectric layer 21. A bottom portion of gate cut trench 10 includes dielectric layer 22 lining the inside surfaces of semiconductor substrate 26 and n-well 25 that is covered by ferroelectric layer 21 that extends up in gate cut trench 10 along a portion of STI 27. Metal 20 in gate cut trench 10 is over a portion of ferroelectric layer 21 with the vertical sides of metal 20 abutting ferroelectric layer 21 (e.g., metal 20 is inside ferroelectric layer 21 and covered by trench contact via 5).

As depicted, FIG. 4 also includes STI 27 over exposed portions of semiconductor substrate 26 and n-well 25 and ILD 29 over STI 27 surrounding portions of trench contact via 5, via contact 4, power rail 3A and 3B, and line 11. Via contact 4 can be vertically stacked on trench contact via 5 to connect one end of each of power rail 3A and 3B to metal 20 and to the de-coupling capacitors formed by ferroelectric layer 21 and dielectric layer 22.

Figure 5A:
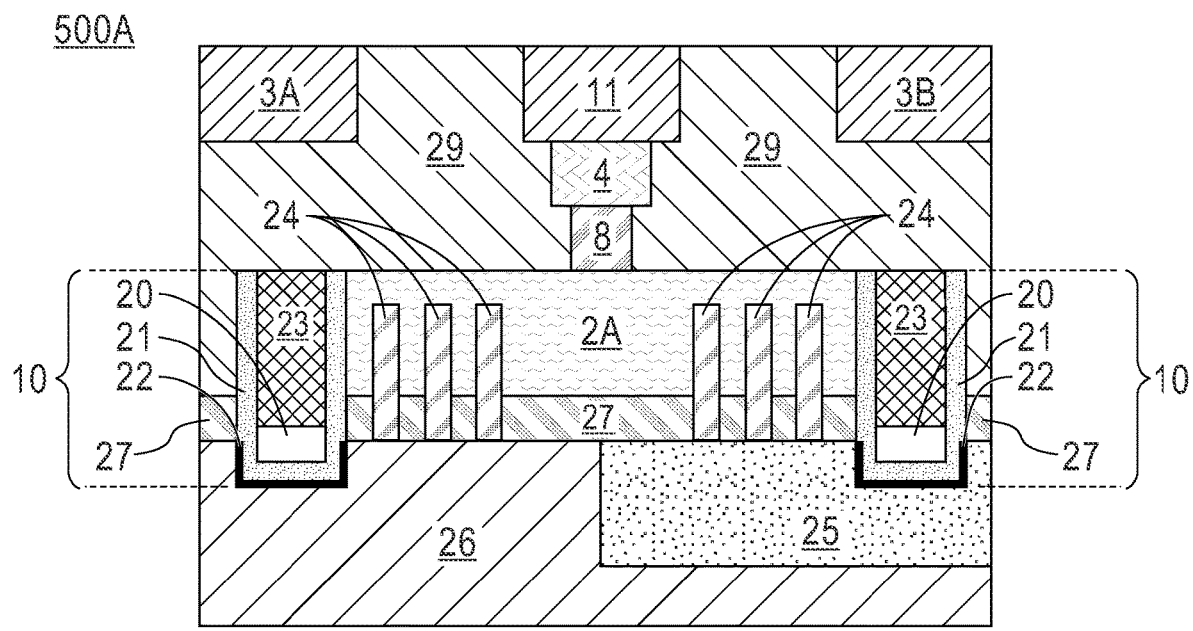
FIG. 5A is a cross-sectional view of a semiconductor structure through section A-A' of the layout of the semiconductor circuit of FIG. 1, in accordance with an embodiment of the present invention.
Figure 6A:
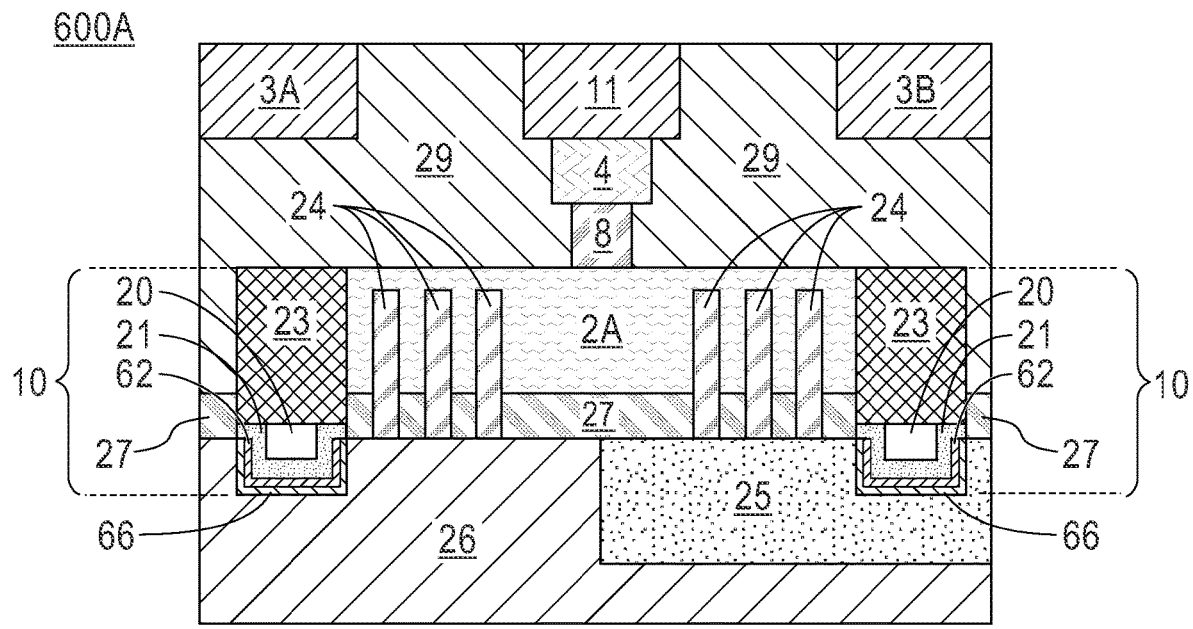
FIG. 6A is a cross-sectional view of a semiconductor structure through section A-A' of the layout of the semiconductor circuit of FIG. 1, in accordance with an embodiment of the present invention.
Figure 6B:
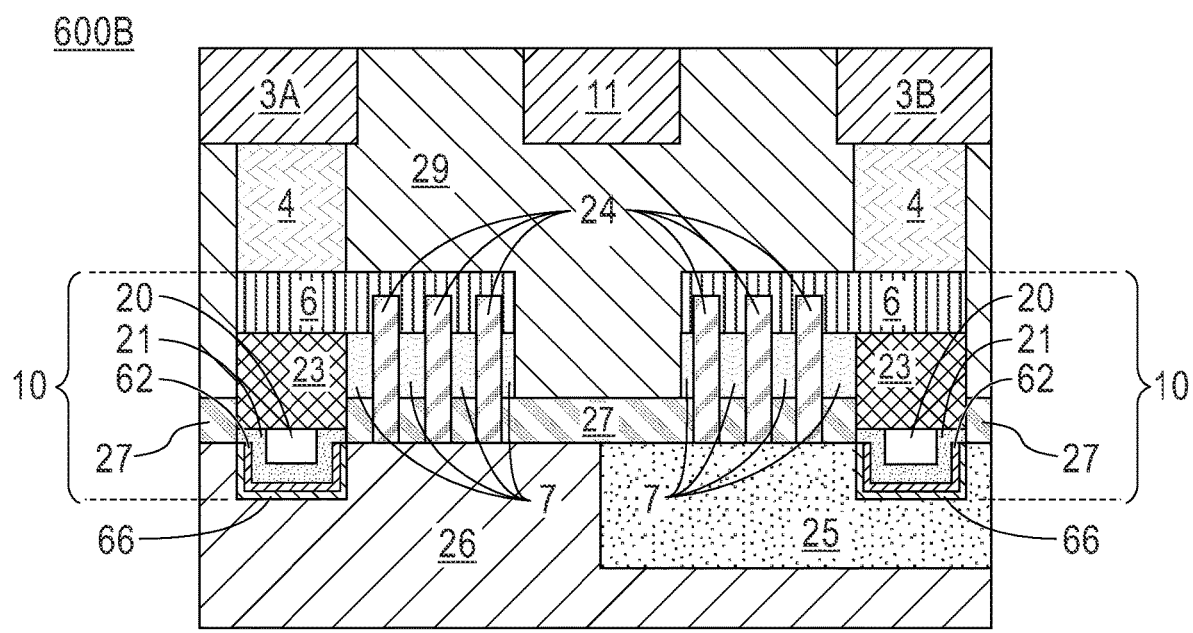
FIG. 6B is a cross-sectional view of the semiconductor structure through section B-B' of the layout of the semiconductor circuit of FIG. 1, in accordance with an embodiment of the present invention.
Figure 6C:
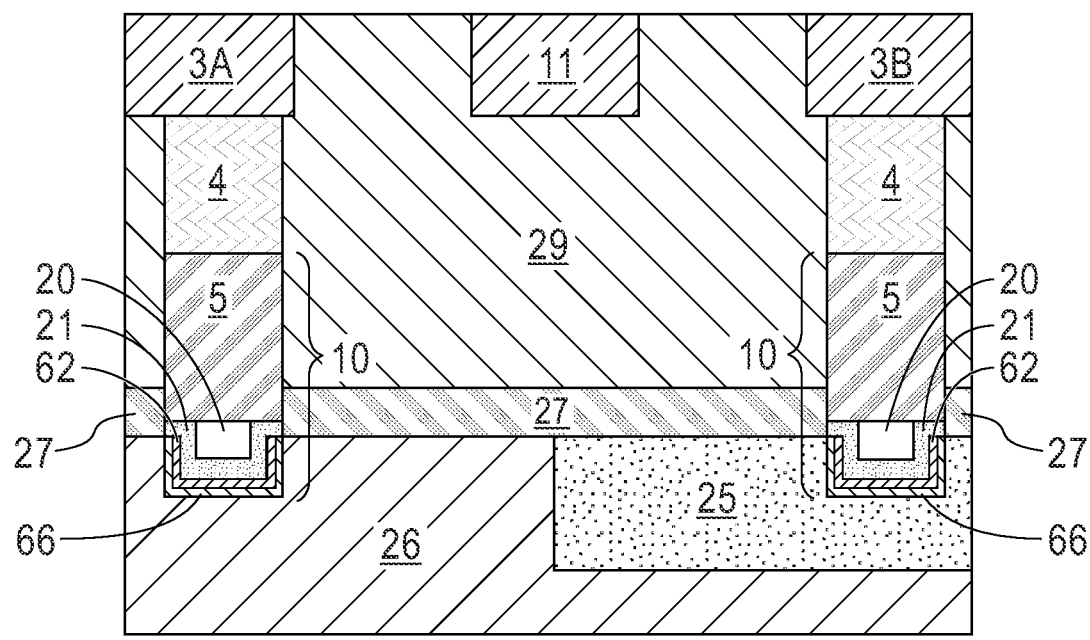
FIG. 6C is a cross-sectional view of the semiconductor structure through section A-A' of the layout of the semiconductor circuit of FIG. 1, in accordance with an embodiment of the present invention.

FIG. 5A is a cross-sectional view of a semiconductor structure 500A through section A-A' of the layout of the invertor of FIG. 1 in accordance with an embodiment of the present invention. FIG. 5A depicts a second embodiment of the present invention.

As depicted, FIG. 5A includes essentially the same elements (e.g., gate 2A, power rail 3A and 3B, via contact 4, line 11, metal 20, ferroelectric layer 21, dielectric layer 22, capacitor dielectric cap 23, fins 24, n-well 25, substrate 26, STI 27, gate contact via 8, and ILD 29) in essentially the same locations as previously discussed in detail with reference to FIG. 2 with the following exception, which is, that ferroelectric layer 21 extends up to the level of the top surface of dielectric cap 23. In this case, a portion of ferroelectric layer 21 deposited in the top portion of gate cut trench 10 is not removed (e.g., by an etch of the top portion of ferroelectric layer 21) and ferroelectric layer 21 extends up to the top surface of dielectric cap 23. As depicted in FIG. 5A, ferroelectric layer 21 covers the vertical walls of gate cut trench 10 and the bottom of gate cut trench 10. Dielectric cap 23 does not extend across gate cut trench 10 from gate 2A to ILD 29 in the top portion of gate cut trench 10 but, is encased by ferroelectric layer 21 (e.g., dielectric cap 23 is inside the vertical sides of ferroelectric layer 21). By eliminating one or more etch processes to remove to the top portion of ferroelectric layer 21 in gate cut trench 10, the manufacture of semiconductor structure 500A can be made easier and a yield loss reduction may occur due to eliminated etch processes. An easier semiconductor manufacturing process can be used to form semiconductor structure 500A than the manufacturing processes used to form semiconductor structure 200 in FIG. 2.

Figure 5B:
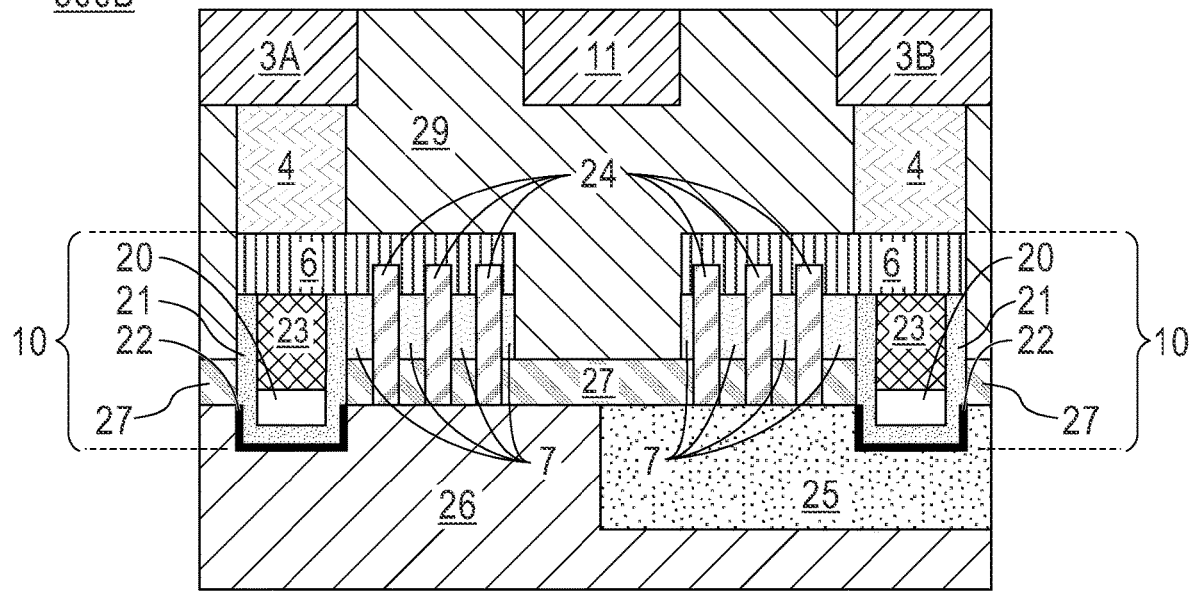
FIG. 5B is a cross-sectional view of the semiconductor structure through section B-B' of the layout of the semiconductor circuit of FIG. 1, in accordance with an embodiment of the present invention.

FIG. 5B is a cross-sectional view of the semiconductor structure 500B through section B-B' of the layout of semiconductor circuit of FIG. 1 in accordance with an embodiment of the present invention. As depicted, FIG. 5B includes essentially the same elements (e.g., power rail 3A and 3B, via contact 4, source/drain contact 6, active area 7, line 11, metal 20, ferroelectric layer 21, dielectric layer 22, capacitor dielectric cap 23, fins 24, n-well 25, substrate 26, STI 27, via contact 4, and ILD 29) in the same locations as discussed in detail with reference to FIG. 2 with the exception that ferroelectric layer 21 extends up to the level of the top surface of dielectric cap 23. In this case, as previously discussed in reference to FIG. 5A, a portion of ferroelectric layer 21 deposited in the top portion of gate cut trench 10 is not removed (e.g., by an etch of the top portion of ferroelectric layer 21). As depicted, dielectric cap 23 is slightly smaller (e.g., is less wide). By eliminating one or more etch processes to remove to the top portion of ferroelectric layer 21 in gate cut trench 10, one or more etch processes can be eliminated and an easier semiconductor manufacturing process can be used to form semiconductor structure 500A and 500B.

Figure 5C:
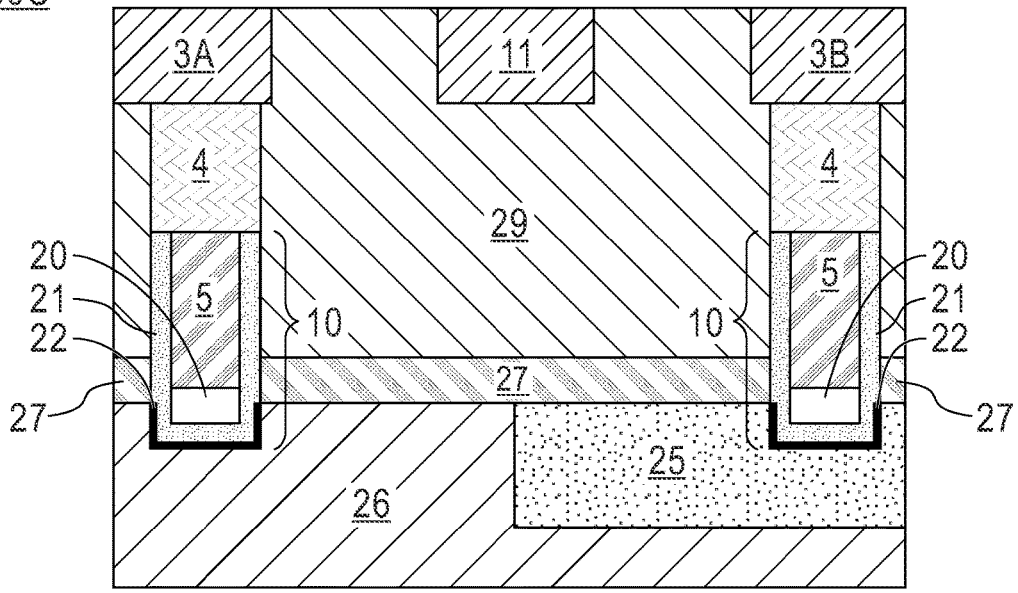
FIG. 5C is a cross-sectional view of the semiconductor structure through section C-C' of the layout of the semiconductor circuit of FIG. 1, in accordance with an embodiment of the present invention.

FIG. 5C is a cross-sectional view of the semiconductor structure 500C through section C-C' of the layout of the semiconductor circuit of FIG. 1 in accordance with an embodiment of the present invention. FIG. 5C depicts an electrical connection of each of power rail 3A and 3B to a single de-coupling capacitor (e.g., ferroelectric layer 21 and dielectric layer 22) through trench contact via 5 and via contact 4. As depicted, FIG. 5C includes essentially the same elements (e.g., power rail 3A and 3AB, via contact 4, trench contact via 5 connecting metal 20 and via contact 4, line 11, ferroelectric layer 21, dielectric layer 22, semiconductor substrate 26 with n-well 25, STI 27, and ILD 29) in the same locations as discussed in detail with reference to FIG. 2 with the following exception that ferroelectric layer 21 extends up to the level of the top surface of dielectric cap 23. In this case, as previously discussed in reference to FIG. 5A, a portion of ferroelectric layer 21 deposited in the top portion of gate cut trench 10 is not removed (e.g., by an etch of the top portion of ferroelectric layer 21). As depicted, dielectric cap 23 is slightly smaller (e.g., is less wide). By eliminating one or more etch processes to remove to the top portion of ferroelectric layer 21 in gate cut trench 10, one or more etch processes can be eliminated and an easier semiconductor manufacturing process can be used to form semiconductor structure 500A, 500B, and 500C. FIG. 5C is essentially the same as FIG. 4 except that ferroelectric layer 21 extends around dielectric cap 23 to contact via contact 4.

FIG. 6A is a cross-sectional view of a semiconductor structure 600A through section A-A' of the layout of the semiconductor circuit of FIG. 1 in accordance with an embodiment of the present invention. As depicted, the materials in gate cut trench 10 may form a metal-ferroelectric-insulator-metal (MFIM) stack. FIG. 6A is a third embodiment of the present invention.

As depicted, FIG. 6A is essentially the same as FIG. 4 except that metal layer 66 lines the inside surfaces of semiconductor substrate 26 and n-well 25 in gate cut trench 10 allowing another dielectric material (e.g., dielectric material 62) to replace dielectric layer 22. As depicted, FIG. 6A includes essentially the same elements as FIG. 2 (e.g., gate 2A, power rail 3A and 3B, via contact 4, line 11, metal 20, ferroelectric layer 21, capacitor dielectric cap 23, fins 24, n-well 25, substrate 26, shallow trench isolation (STI) 27, gate contact via 8, and ILD 29) in the same locations with the exception that metal layer 66 replaces dielectric layer 22 on semiconductor substrate 26 and n-well 25 and a new dielectric material, dielectric material 62, is over metal layer 66 under ferroelectric layer 21. As depicted, the bottom portion of gate cut trench 10 includes metal layer 66 under dielectric material 62, ferroelectric layer 21 and metal 20 inside ferroelectric layer 21.

In various embodiments, metal layer 66 is one of titanium nickel (TiN), titanium aluminum carbon (TiAlC), tungsten (W), tungsten nickel (WN), or tantalum nickel (TaN). Metal layer 66 is not limited to these metals but may be another material. A thickness of metal layer 66 can range from 3 nm to 10 nm but, is not limited to these thicknesses. As depicted, the top surface of metal layer 66 is parallel to the top surface of semiconductor substrate 26 and n-well 25.

The deposition of metal layer 66 inside of gate cut trench 10 prevents the formation of a silicon dioxide layer on semiconductor substrate 26. The MFIM stack with the metal liner, metal layer 66, enables use of high-k material with a dielectric constant greater than 3.9 as the dielectric material 62 without a $SiO_2$ interlayer on the surfaces of semiconductor substrate 25 or n-well 25 in gate cut trench 10. Examples of materials for dielectric material 62 can include aluminum oxides, such as, Al2O3, zirconium oxides, such as, $ZrO_2$, titanium oxides, such as, $TiO_2$, and tantalum oxides, such as, $Ta2O_5$, but are not limited to these high k dielectric materials.

In various embodiments, dielectric material 62 is any non-silicon dioxide dielectric material. For example, dielectric material 62 may be one of $Ta2O_5$ or $TiO_2$ dielectric material that exhibits a Qmax greater than the Qmax of silicon dioxide, where Qmax is the maximum charge which can be applied to a dielectric before breakdown. In some embodiments, dielectric material 62 is a high-k dielectric material. A thickness of dielectric material 62 can range from 3 nm to 10 nm but, is not limited to these thicknesses. As depicted, the top surface of dielectric material 62 is parallel to the top surface of metal layer 66 and the top surface of semiconductor substrate 26 with n-well 25. Dielectric material 62 can be selected to provide a higher Qmax (e.g., by using a high k dielectric material) which, in turn, allows a higher remnant polarization of the material in ferroelectric layer 21.

In various embodiments, the combination of metal layer 66 and dielectric layer 66 provides an ability to improve de-coupling capacitor electrical performance with the same depth, d, of gate cut trench 10 in semiconductor substrate 26 and n-well 35. An example of an improvement in the electrical performance (e.g., improved capacitance density) with metal layer 66 and dielectric material 62 is depicted and discussed later with reference to FIG. 9. The addition of metal layer 66 and dielectric material 62 can improve the predicted capacitance density with a gate cut trench depth of 20 nm by as much as two to three times higher predicted capacitance density. In some embodiments, an implantation of n+ and/or p+ regions in gate cut trench 10 opening occurs to improve contact resistance from a well, such as n-well 25, to metal layer 66 as the bottom electrode.

FIG. 6B is a cross-sectional view of the semiconductor structure 600B through section B-B' of the layout of the semiconductor circuit of FIG. 1 in accordance with an embodiment of the present invention. As depicted, FIG. 6B includes power rail 3A and 3B, via contact 4, source/drain contact 6, active area 7, line 11, metal 20, metal layer 66, ferroelectric layer 21, dielectric material 62, capacitor dielectric cap 23, fins 24, n-well 25, substrate 26, shallow trench isolation (STI) 27, via contact 4, and interlayer dielectric material (ILD) 29. FIG. 6B is essentially the same as FIG. 3 except that dielectric layer 22 is replaced with metal layer 66 and dielectric material 62 is added inside metal layer 66 inside a bottom portion of gate cut trench 10. Metal layer 66 acts as a metal liner separating semiconductor substrate 26 and n-well 35 preventing the formation of silicon dioxide on semiconductor substrate 26 in gate cut trench 10. Semiconductor structure 600B depicts a bottom portion of gate cut trench 10 with metal 20 inside ferroelectric layer 21 and covered by dielectric cap 23 with dielectric material 62 under ferroelectric layer 21 which is over metal layer 66 inside a portion of semiconductor substrate 26 and n-well 25.

FIG. 6C is a cross-sectional view of the semiconductor structure 600C through section A-A' of the layout of the semiconductor circuit of FIG. 1 in accordance with an embodiment of the present invention. As depicted, FIG. 6C includes power rail 3A and 3AB, via contact 4, trench contact via 5 connecting metal layer 66 and via contact 4, line 11, ferroelectric layer 21, dielectric material 62, semiconductor substrate 26 with n-well 25, STI 27, and ILD 29. FIG. 6C is essentially the same as FIG. 4 except that metal layer 66 is added as a liner in semiconductor substrate 26 and dielectric material 62 can be added over metal layer 66 in the bottom portion of gate cut trench 10. Metal layer 66 separates dielectric material 62 from semiconductor substrate 26 and n-well 25. As depicted, metal layer 66 does not extend up to trench contact via 5. A portion of ferroelectric layer 21 separates metal layer 66 and trench contact via 5 that connects electrically through via contact 4 to one of power rail 3A or 3B.

Figure 9:
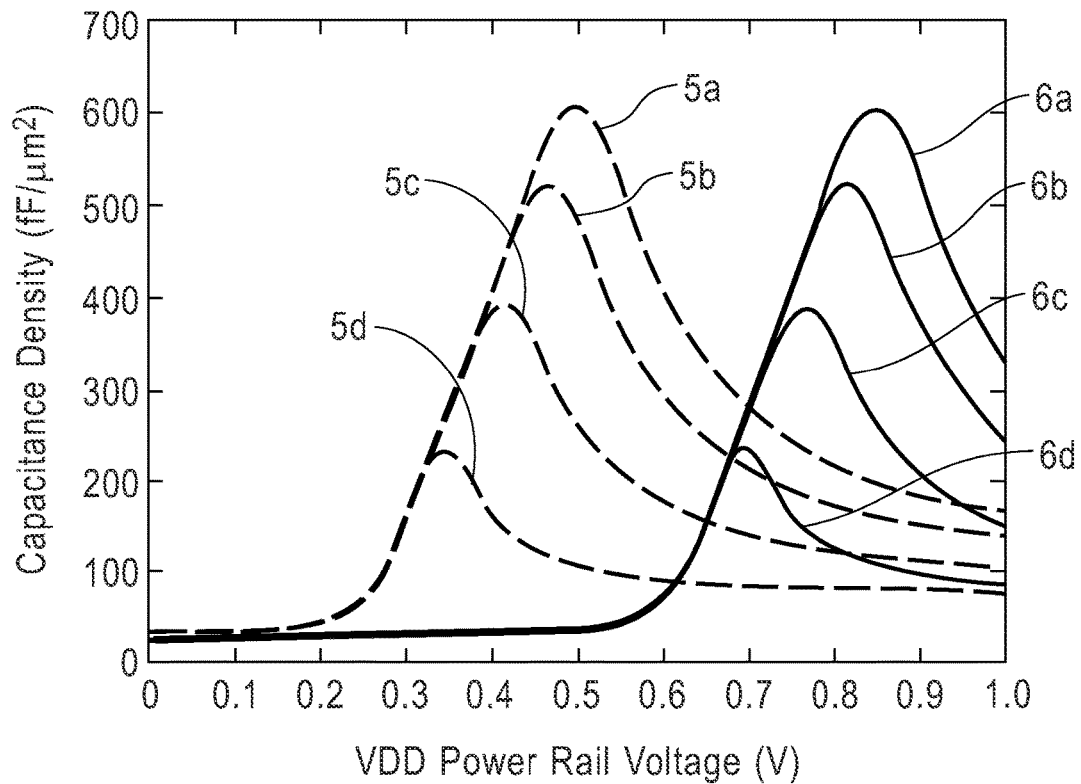
FIG. 9 is a graph depicting the results of TCAD analysis of the 4.4 eV work function metal placed on top of a ferroelectric material, and the 4.9 eV work function metal placed on top of a ferroelectric material, when the gate cut trench depth is 20 nm and no silicon dioxide layer is adjacent to the semiconductor substrate, in accordance with the second embodiment of the present invention.

FIG. 7 is a graph depicting the results of TCAD analysis of a 4.4 eV work function metal (WFM), placed on top of ferroelectric layer 21, and a 4.9 eV work function metal, placed on top of the ferroelectric layer 21, when there is no gate cut trench in accordance with a second embodiment of the present invention. In various embodiments, the work function metal is metal 20 in FIG. 2-4. Technology computer-aided design (TCAD) is a branch of electronic design automation that models semiconductor fabrication and semiconductor circuit operation. As depicted in FIGS. 7-9, TCAD analysis predicts capacitance density for a specific Vdd power rail voltage that is depicted as a capacitance vs. voltage (C-V) curve. The TCAD analysis assumes a thickness of 4 nm for ferroelectric layer 21 and a thickness of 1 nm for dielectric layer 22 (e.g., silicon dioxide). The TCAD analysis uses a ferroelectric remnant polarization of approximately 2.85 uC/cm$^2$ and a dielectric Qmax of about 3.45 μC/cm$^2$, where Qmax is the maximum amount of electrical charge that can be applied to the dielectric before the dielectric breaks down. The single lower line is reference line for the prediction for a metal oxide semiconductor (MOS) de-coupling capacitor with a 4.4 eV work function metal, a 1 nm silicon dioxide dielectric, and the same geometry as the ferroelectric/dielectric capacitors also simulated.

Typically, a 4.4 eV WFM is commonly associated with a NFET operation and a 4.9 eV WFM is commonly associated with a PFET operation. In FIG. 7, the analysis assumes gate cut trench 10 depth, d, is zero, the remnant polarization is 2.85 μC/cm$^2$ (e.g., less than silicon dioxide), and Qmax is approximately 3.45 μC/cm$^2$.

Each of the lines 1a, 1b, 1c, and 1d for a 4.4 eV work function metal on a ferroelectric material (e.g., ferroelectric layer 21) represents a predicted capacitance density associated with a specific possible negative capacitance slope where the specific negative capacitance slope may be associated with a specific material selection (e.g., for ferroelectric layer 21) or a different material thickness forming the de-coupling capacitors depicted in FIGS. 2, 3, and 4, for example. Each of lines 1a, 1b, 1c, and 1d represents a predicted capacitance density in femtofarads (fF) per square micron (μm$^2$) versus voltage (V) where the voltage is the VDD power rail voltage (e.g., power rail 3A in FIG. 1). The peak of the curves for line 1a, 1b, 1c, and 1d are representative of a voltage of 0.3 to 0.4 V for the VDD power rail. The arrow depicted on lines 1a, 1b, 1c, and 1d depicts increasing capacitance matching. Moving backwards from line 1d to 1a, the negative capacitance slope of the ferroelectric is reduced in order to achieve an absolute value slope that is closer to the series dielectric positive capacitance, with line 1a representing the closest match between these two slopes. Increasing capacitance matching results in an increase in dQ/dV, which increases the total capacitance of the ferroelectric/dielectric series stack.

Similarly, each of the lines 2a, 2b, 2c, and 2d for a 4.9 eV work function metal on a ferroelectric material (e.g., ferroelectric layer 21) represents a predicted capacitance density associated with a specific possible negative capacitance slope where the specific negative capacitance slope may associated with a specific material selection (e.g., for ferroelectric layer 21) or a different material thickness forming the de-coupling capacitors depicted in FIGS. 2, 3, and 4, for example. The peak of the curves for line 2a, 2b, 2c, and 2d are representative of a voltage of 0.8 to 0.9 V for the VDD power rail.

FIG. 8 is a graph depicting the results of TCAD analysis of 4.4 eV work function metal placed on top of a ferroelectric material and 4.9 eV work function metal placed on top of a ferroelectric material when gate cut trench 10 depth is 20 nm in accordance with the second embodiment of the present invention. FIG. 8 is similar to FIG. 7 except that the depth, d, of gate cut trench 10 is increased from 0 nm to 20 nm. As depicted in FIG. 8, the additional depth of gate cut trench 10 increases the peak capacitance density for each of the lines 3a, 3b, 3c, and 3d with the 4.4 eV WFM and in lines 4a, 4b, 4c, and 4d for the 4.9 WFM by about a factor of 2 or more over the predicted peak capacitance densities in FIG. 7 for the same materials. By increasing the depth of the gate cut trench in the semiconductor substrate to 20 nm, a significant improvement in capacitance density can be achieved according to the TCAD analysis depicted in FIG. 8.

FIG. 9 is a graph depicting the results of TCAD analysis of a 4.4 eV work function metal placed on top of a ferroelectric material and 4.9 eV work function metal placed on top of a ferroelectric material when gate cut trench 10 depth is 20 nm when no silicon dioxide layer is adjacent to the semiconductor substrate in accordance with the third embodiment of the present invention. FIG. 9 relates to the electrical analysis of the structures depicted in FIGS. 6A, 6B, and 6C with an MFIM stack where metal layer 66 is deposited in gate cut trench before dielectric material 62 and ferroelectric layer 21. In this case, dielectric material 62 is not in contact with the semiconductor substrate and, therefore, no silicon dioxide layer is formed on semiconductor substrate. Additionally, when metal layer 66 is deposited on semiconductor substrate 26, a dielectric material with a higher dielectric constant can be used for dielectric material 62 (e.g., TaO$_2$ or TiO$_2$) although dielectric material 62 is not limited to these materials or to materials with a higher dielectric constant.

Each of lines 5a, 5b, 5c, and 5d for a 4.4 eV WFM represents a predicted capacitance density for associated with a specific possible remnant polarization of the ferroelectric layer 21, where the specific remnant polarization may be associated with a specific material selection (e.g., for ferroelectric layer 21) or a different material thickness forming the de-coupling capacitors depicted in FIGS. 2, 3, and 4, for example. Each curve assumes the same negative capacitance slope. Remnant polarization is increased from line 5d to line 5a and the peak capacitance increases accordingly. Higher remnant polarization in the ferroelectric layer 21 requires larger Qmax in the dielectric material 62, typically corresponding to a requirement for higher-k dielectric layers and no silicon dioxide interlayer.

Similarly, Lines 6a, 6b, 6c, and 6d for a 4.9 eV WFM represent a predicted capacitance density associated with a specific remnant polarization of the ferroelectric layer 21, where the specific remnant polarization may be associated with a specific material selection (e.g., for ferroelectric layer 21) or a different material thickness in the de-coupling capacitor. The depth, d, of gate cut trench 10 in FIG. 9, is the same as the gate cut depth of FIG. 8 (e.g., 20 nm). It is important to note that an MFIM stack of materials in gate cut trench 10 (e.g., like metal 20, ferroelectric layer 21, dielectric material 62, and metal layer 66) without SiO$_2$, provides a significantly higher maximum peak capacitance density for each of set of lines 5a, 5b, 5c, 5d and lines 6a, 6b, 6c, 6d when compared the corresponding set of lines in FIG. 8 (e.g., compared to lines 3a, 3b, 3c, 3d and lines 4a, 4b, 4c, 4d, respectively). For example, as depicted in FIG. 9, the peak capacitance density associated with line 6a is more twice the peak capacitance density of the peak capacitance density of line 4a in FIG. 8.

Figure 10:
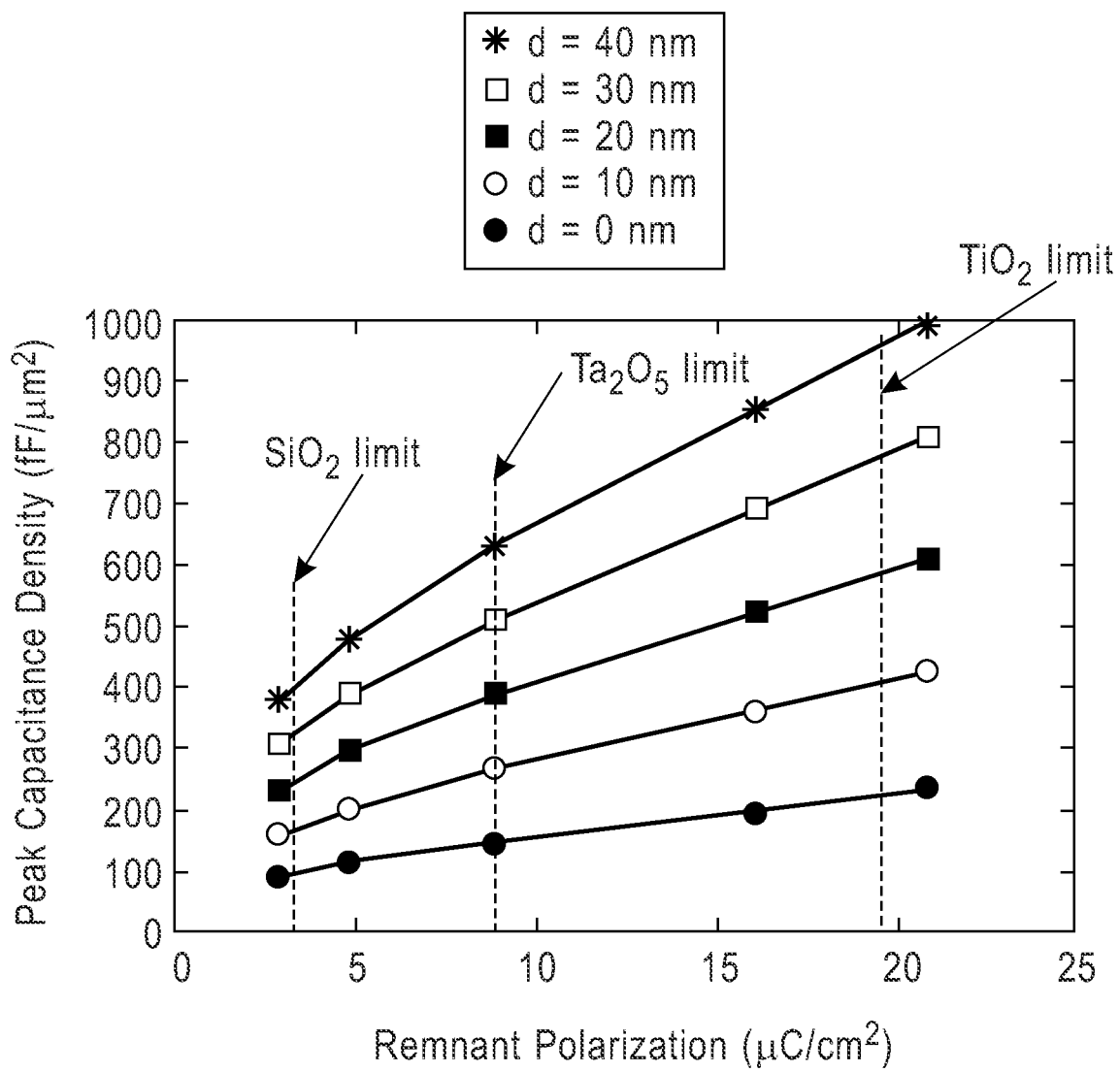
FIG. 10 is a graph depicting a peak capacitance versus remnant polarization for various materials and various gate cut trench depths, in accordance with the second embodiment of the present invention.

FIG. 10 is a graph depicting a peak capacitance versus remnant polarization for various materials and various gate cut trench depths in accordance with the second embodiment of the present invention. As depicted, FIG. 10 provides a predicted peak capacitance in fF/μm$^2$ at various gate cut trench depths (e.g., ranging from 0 nm to 40 nm) with various ferroelectric remnant polarizations (Pr) in μC/cm$^2$.

Also depicted on FIG. 10 is a dielectric polarization limit (Qmax) for several materials, such as, $SiO_2$, $Ta_2O_5$, and $TiO_2$. It is important to note that FIG. 10 illustrates the theoretical, potential ability to increase a peak capacitance density with a material by increasing a depth of gate cut trench 10 or by using a material capable of providing a higher Qmax.

When comparing the peak capacitance densities depicted in FIGS. 7, 8, 9, and 10, it is easy to determine that the peak capacitance density of FIG. 7, with a 0 nm gate cut trench, is greatly increased in FIGS. 8-10 with deeper gate cut trench (e.g., a larger d), and the peak capacitance density can be further improved by adding a metal layer or liner under the dielectric layer (e.g., metal layer 66 under dielectric material 62), to prevent the formation of $SiO_2$ on the semiconductor material forming gate cut trench 10.

Furthermore, looking at FIG. 10, in some cases, when the metal liner (e.g., metal layer 66) is present, a different dielectric material, such as, $TiO_2$, is compatible with a higher Pr and theoretically, provides a much higher peak capacitance density with a 40 nm depth of gate cut trench 10 than a dielectric material, such as, $SiO_2$.

As depicted in FIGS. 7-10, embodiments of the present invention provide an ability for a greatly increased peak capacitance density using the de-coupling capacitors with the various semiconductor structures discussed with reference to FIGS. 1-6C. Embodiments of the present invention illustrate a number of design tradeoffs and material selections that can impact and increase the peak capacitance density provided by the de-coupling capacitors to the power rails. An increase capacitance provided to the power rails can reduce the power rail noise and therefore, improve device performance.

FIGS. 11-16 depict one method of forming the semiconductor circuit depicted in layout 100 of FIG. 1. Specifically, the method discussed with respect to FIGS. 11-16 relates to the semiconductor structure 400 depicted in FIG. 4 where power rail 3A and 3B electrically connect to the de-coupling capacitors formed by ferroelectric layer 21 and dielectric layer 22 in gate cut trench 10.

Figure 11:
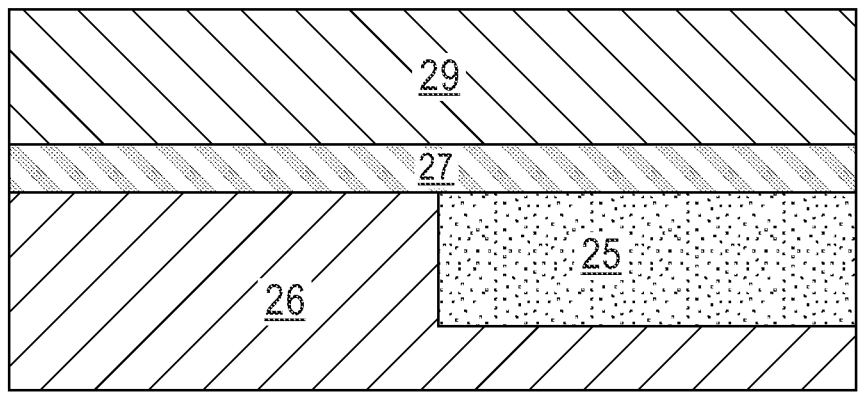
FIG. 11 depicts a cross-section through C-C' of FIG. 1 to form a semiconductor structure after gate deposit, in accordance with an embodiment of the present invention.

FIG. 11 depicts a cross-section through C-C' of FIG. 1 to form semiconductor structure 1100 after depositing a layer of ILD 29 in accordance with an embodiment of the present invention. As depicted, FIG. 11 includes ILD 29 on STI 27 which is over semiconductor substrate 26 and n-well 25 in semiconductor substrate 26. Semiconductor structure 1100 is formed with known semiconductor processes including n-type doping of a portion of semiconductor substrate 26, STI 27 deposition over semiconductor substrate 26 and n-well 25. A deposition method, such as atomic layer deposition (ALD) or CVD, deposits a layer of ILD 29 over STI 27, to form semiconductor structure 1100. In some cases, a chemical mechanical polish (CMP) of ILD 29 may occur.

Figure 12:
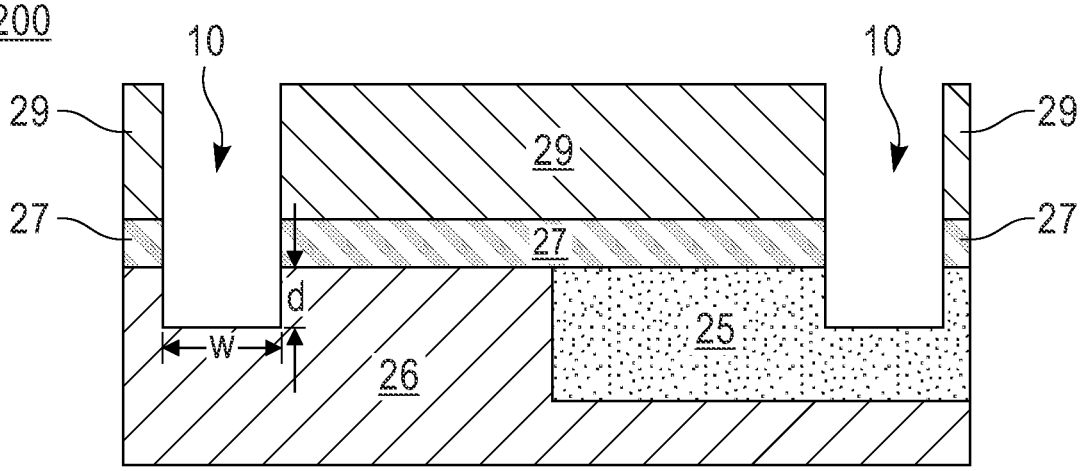
FIG. 12 depicts a cross-section through A-A' of FIG. 1 to form the semiconductor structure after etching a gate cut trench through an interlayer dielectric (ILD), through an STI layer, and through a top portion of the semiconductor substrate, in accordance with an embodiment of the present invention.

FIG. 12 depicts a cross-section through C-C' of FIG. 1 to form semiconductor structure 1200 after etching gate cut trench 10 through a portion of ILD 29, through a portion of STI 27, and through a top portion of semiconductor substrate 26 and n-well 25 in accordance with an embodiment of the present invention.

Using one or more photolithographic processes with gate cut mask 1 depicted in FIG. 1 and known gate cut etch processes for a selective etch of portions of ILD 29, STI 27, and a top portion of semiconductor substrate 26 and n-well 25, gate cut trench 10 is formed. For example, one or more reactive ion etches (RIE), a portion of semiconductor substrate 26 and n-well 25 are etched to a depth, d, as depicted and to a width, w. For example, a single RIE or multiple RIE etches using gate cut mask 1 can be used to etch gate trench 10 through ILD 29, STI 27, and a top portion of semiconductor substrate 26 and m-well 25. As depicted in FIG. 10, the depth, d, of gate cut trench 10 in semiconductor substrate 26 and n-well 25 impacts the resulting capacitance density.

As depicted in FIG. 12, the selective RIE etches can remove two defined portions of ILD 29, two portions of STI 27 under the removed portions of ILD 29, a portion of semiconductor substrate 26 and a portion of n-well 25 under the removed portions of ILD 29. Conventional gate cut trenches usually use STI 27 as an etch stop (i.e., conventional gate cut trenches do not etch into portions of semiconductor substrate 26 or n-well 25). In embodiments of the present invention, gate cut trench 10 is etched to a deeper level than a conventional gate cut trench. While a typical gate cut trench cut through a gate, like gate 2A to a top of STI 27 or to a top portion of STI 27, in various embodiments of the present invention, the etch processes forming gate cut trench 10 remove a portion of semiconductor substrate 26 and n-well 25 as well as a portion of STI 27 and a portion of ILD 29 as defined by etch mask 1 in FIG. 1.

Figure 13:
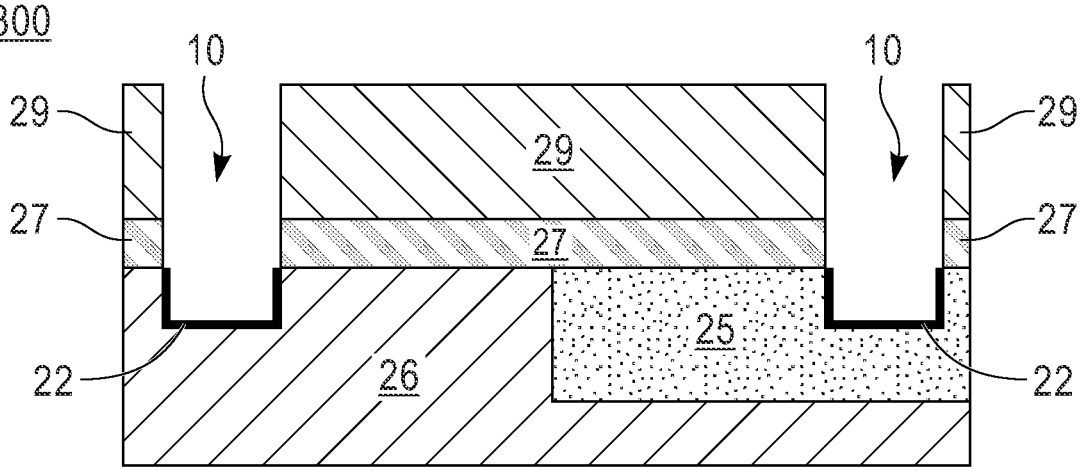
FIG. 13 depicts a cross-section through C-C' of FIG. 1 to form the semiconductor structure after a dielectric material layer formation on the semiconductor substrate, in accordance with an embodiment of the present invention.

FIG. 13 depicts a cross-section through A-A' of FIG. 1 to form semiconductor structure 1300 after dielectric layer 22 formation on semiconductor substrate 26 and n-well 25 in gate cut trench 10 in accordance with an embodiment of the present invention. As depicted, dielectric layer 22 covers exposed surfaces of semiconductor substrate 26 and n-well 25 in gate cut trench 10. Dielectric layer 22 is deposited or grown with known semiconductor manufacturing processes, such as oxidation or atomic layer deposition (ALD), for example. A thickness of dielectric layer 22 may range from 1 nm to 4 nm but, is not limited to these thicknesses.

Figure 14:
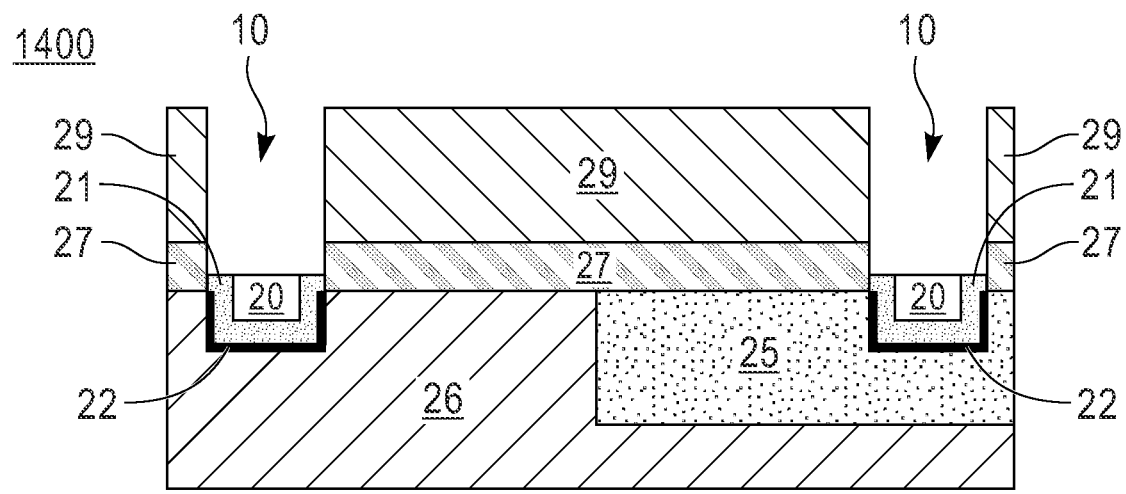
FIG. 14 depicts a cross-section through C-C' of FIG. 1 to form the semiconductor structure after a deposition and etch of a ferroelectric material and a metal material in the gate cut trench, in accordance with an embodiment of the present invention.

FIG. 14 depicts a cross-section through A-A' of FIG. 1 to form semiconductor structure 1400 after a deposition and etch of ferroelectric layer 21 and metal 20 in gate cut trench 10 in accordance with an embodiment of the present invention. Ferroelectric layer 21 is deposited with known semiconductor manufacturing processes, such as atomic layer deposition (ALD) or another conformal deposition process, in gate cut trench 10 over exposed surfaces of dielectric layer 22, STI 27, and gate 2A. A thickness of ferroelectric layer 21 may range from 2 nm to 5 nm but, is not limited to these thicknesses.

Metal 20 can be deposited in gate cut trench 10 over ferroelectric layer 21. For example, metal 20 can be deposited by one or more known deposition processes (e.g., ALD, CVD, etc.). As previously discussed, in some embodiments, metal 20 is composed of a thin layer of a work function metal and a bulk metal (e.g., titanium nitride and tungsten). In this case, two deposition processes may occur.

After the deposition of metal 20, another selective etch process, for example, using RIE or wet etch, occurs selectively removing a portion of ferroelectric layer 21 and metal 20 in a top portion of gate cut trench 10. As depicted in FIG. 14, after this etch process, the top surface of ferroelectric layer 21 and metal 20 is below the bottom surface of STI 27 and above the top surface of semiconductor substrate 26 and n-well 25. For example, the top surface of ferroelectric layer 21 and metal 20 can be approximately halfway between the bottom surface of STI 27 and the top surface of semiconductor substrate 26 and n-well 25 after etching.

Figure 15:
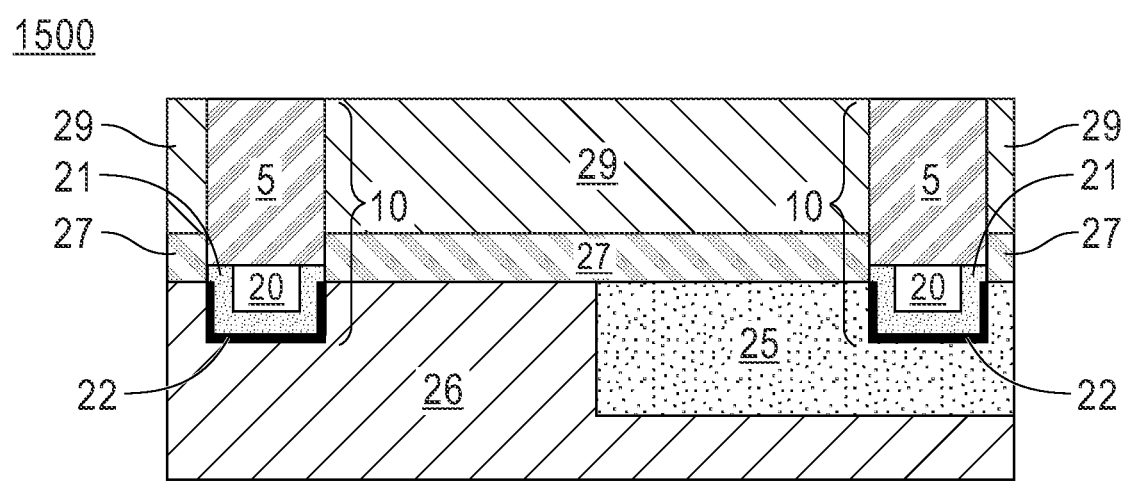
FIG. 15 depicts a cross-section through C-C' of FIG. 1 to form the semiconductor structure after a deposition of dielectric cap material over the semiconductor structure, and a planarization of a top surface of the semiconductor structure, in accordance with an embodiment of the present invention.

FIG. 15 depicts a cross-section through A-A' of FIG. 1 to form semiconductor structure 1500 after a deposition of a contact material over semiconductor structure 1500 and a planarization of a top surface of semiconductor structure 1500 in accordance with an embodiment of the present invention. Using known deposition processes, such as ALD or CVD, gate cut trench 10 is first filled with dielectric cap 23, which runs the full length of gate cut trench 10. Then, a patterning step is performed to create a contact via opening through dielectric cap 23, exposing the top surface of metal 20. Using known deposition processes, such as ALD or CVD, a layer of contact material (e.g., tungsten, titanium, etc.) can be deposited over semiconductor structure 1500 (e.g., on the exposed surfaces of ILD 29, STI 27, ferroelectric layer 21 and metal 20 in gate cut trench 10). The metal deposition completely fills gate cut trench 10 and cover the top surfaces of semiconductor structure 1500.

After depositing the layer of contact material for trench contact via 5 over semiconductor structure 1500, a planarization process, such as a chemical mechanical polish (CMP), can occur. The CMP removes the contact material from the top surfaces of ILD 29 and may remove a top portion of ILD 29. The remaining contact material in gate cut trench 10 forms trench contact via 5.

Figure 16:
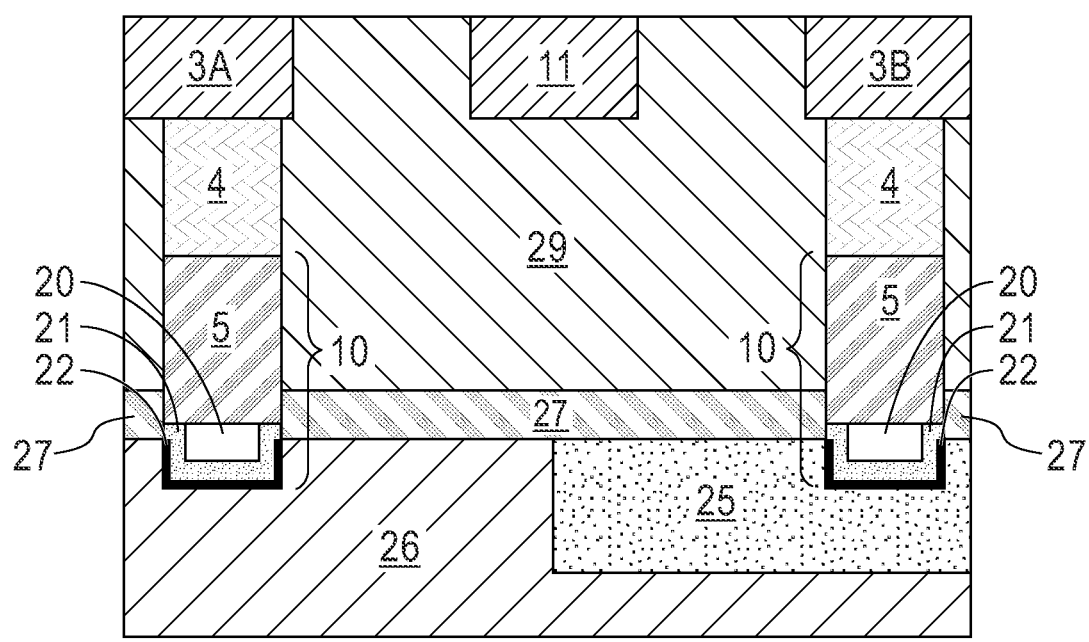
FIG. 16 depicts a cross-section through C-C' of FIG. 1 to form the semiconductor structure after forming contact vias, in accordance with an embodiment of the present invention.

FIG. 16 depicts a cross-section through C-C' of FIG. 1 to form semiconductor structure 1600 after forming via contact 4 and power rail 3A and 3B in accordance with an embodiment of the present invention. Using known contact via formation processes, a deposition of another layer of ILD 29 over semiconductor structure 1600 can occur. Using photolithography and conventional etch processes, such as RIE, a wet chemical etch, or other etching processes, a selective etch of ILD 29 removes a portion of ILD 29 that exists over trench contact via 5. A contact material deposition over semiconductor structure 1600 occurs that fills the area or via hole formed by the removal of the portion of ILD 29 to form via contact 4. A CMP of semiconductor structure 1600 removes the contact material from the top surface of ILD 29 to complete via contact 4.

Using back end of the line (BEOL) processes, power rail 3A and 3B can be formed on via contact 4. For example, another deposition of ILD 29 over the top of via contact 4 and ILD 29 occurs. Another CMP may occur to planarize the top surface of the deposited ILD 29. The deposition of a first metal layer (M1) can occur using known BEOL deposition processes followed by a selective etch of M1 forms power rail 3A and power rail 3B.

As depicted in semiconductor structure 1600, the de-coupling capacitors formed in gate cut trench 10 with dielectric layer 22 and ferroelectric layer 21 connect to one end of each of power rail 3A and 3B through metal 20, trench contact via 5, and via contact 4. Power rail 3A and 3B each can be considered to include via contact 4, trench contact via 5, and metal 20. In some embodiments, power rail 3B that is above n-well 25 can be a top electrode of a PFET and n-well 25 can be a bottom electrode of the PFET. Power rail 3B is not limited to a PFET in other embodiments (e.g., n-well 25 can be a p-well forming an NFET).

As known to one skilled in the art, variations or a different order of the some of the steps of the method related to FIGS. 11-16 can be done (e.g., differences in when ILD layers and etches occur, etc.) to achieve the semiconductor structure 1600. Additionally, as known to one skilled in the art, using similar processes to those discussed to form semiconductor structure 1600, semiconductor structures 200, 300, 500A, 500B, and 500C can be formed. Additionally, as known to one skilled in the art, with some new materials (e.g., metal layer 66 and dielectric material 62) and slight changes to the processes discussed with respect to FIGS. 11-16, semiconductor structures 600A, 600B and 600C can be formed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
a first power rail;
one or more vertically stacked contact vias connecting the first power rail to a top surface of a trench contact, wherein the trench contact connecting to a metal and a ferroelectric layer in a portion of a first de-coupling capacitor; and
the first de-coupling capacitor directly contacting at least one gate and in a first portion of a semiconductor substrate, wherein the first de-coupling capacitor includes the layer of a ferroelectric material over a first dielectric layer and contacting a portion of an isolation trench, and wherein the metal is in contact with the ferroelectric material.

2. The semiconductor structure of claim 1, wherein the first de-coupling capacitor is under and parallel to the first power rail.

3. The semiconductor structure of claim 1, wherein a portion of the metal is under a dielectric cap.

4. The semiconductor structure of claim 3, wherein a top surface of the metal is above a top surface of the semiconductor substrate and below a top surface of an isolation trench that is on the semiconductor substrate.

5. The semiconductor structure of claim 1, wherein the first dielectric layer is a layer of silicon dioxide.

6. The semiconductor structure of claim 1, wherein the ferroelectric material is inside the portion of the isolation trench and the first dielectric layer.

7. The semiconductor structure of claim 1, wherein the ferroelectric material has a top surface below a bottom surface of the at least one gate.

8. The semiconductor structure of claim 1, wherein the ferroelectric material has the top surface above the top surface of the first dielectric layer.

9. The semiconductor structure of claim 3, wherein the metal is composed of more than one metal material.

10. The semiconductor structure of claim 1, wherein a portion of the first de-coupling capacitor is under a dielectric cap that is under a source/drain contact.

11. The semiconductor structure of claim 1, wherein the ferroelectric material is composed of a material selected from the group consisting of hafnium zirconium oxide, lead zirconium titanate, silicon-doped hafnium oxide, and barium titanite.

12. A semiconductor structure comprising:
a first power rail;
one or more vertically stacked contact vias connecting the first power rail to a portion of a first de-coupling capacitor;
the first de-coupling capacitor in a first portion of a semiconductor substrate and a portion of an isolation trench, wherein the first de-coupling capacitor is parallel the first power rail;
a second power rail;

one or more vertically stacked contact vias connecting the second power rail to a portion of a second de-coupling capacitor in a second portion of the semiconductor substrate and the isolation trench; and one or more active device regions on a third portion of the semiconductor substrate adjacent to the first portion of the semiconductor substrate and on a fourth portion of the semiconductor substrate adjacent to the second portion of the semiconductor substrate, wherein the second portion of the semiconductor substrate and the fourth portion of the semiconductor substrate are doped.

13. The semiconductor structure of claim 12, wherein the second portion of the semiconductor substrate and the fourth portion of the semiconductor substrate are doped with a doping material selected from the group of an n-type dopant material and a p-type dopant material.

14. The semiconductor structure of claim 12, wherein the first de-coupling capacitor includes a first dielectric layer on the first portion of the semiconductor substrate.

15. The semiconductor structure of claim 14, wherein the first de-coupling capacitor includes a layer of a ferroelectric material over the first dielectric layer and contacting a portion of the isolation trench directly above the semiconductor substrate.

16. The semiconductor structure of claim 15, wherein a metal is in contact with the ferroelectric material, and wherein a first portion of the metal is under a first dielectric cap.

17. The semiconductor structure of claim 16, wherein the one or more vertically stacked contact vias connecting the first power rail connect to a top surface of a second portion of the metal and the ferroelectric layer.

18. The semiconductor structure of claim 12, wherein the ferroelectric material is inside the portion of the isolation trench and the first dielectric layer.

19. The semiconductor structure of claim 12, wherein the ferroelectric material has the top surface above the top surface of the first dielectric layer.

20. The semiconductor structure of claim 15, wherein the metal is composed of more than one metal material.

21. The semiconductor structure of claim 12, wherein a portion of the first de-coupling capacitor is under a second dielectric cap that is under a source/drain contact.

* * * * *